(12) United States Patent
Yamamoto et al.

(10) Patent No.: US 9,947,722 B2
(45) Date of Patent: Apr. 17, 2018

(54) SEMICONDUCTOR MEMORY DEVICE

(71) Applicant: TOSHIBA MEMORY CORPORATION, Minato-ku, Tokyo (JP)

(72) Inventors: Kazuhiko Yamamoto, Mie (JP); Kunifumi Suzuki, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 9 days.

(21) Appl. No.: 15/266,552

(22) Filed: Sep. 15, 2016

(65) Prior Publication Data
US 2017/0271403 A1 Sep. 21, 2017

Related U.S. Application Data

(60) Provisional application No. 62/309,105, filed on Mar. 16, 2016.

(51) Int. Cl.
*H01L 27/24* (2006.01)
*H01L 45/00* (2006.01)
*G01C 13/00* (2006.01)
*G11C 13/00* (2006.01)

(52) U.S. Cl.
CPC .......... *H01L 27/249* (2013.01); *G11C 13/004* (2013.01); *G11C 13/0007* (2013.01); *G11C 13/0026* (2013.01); *G11C 13/0028* (2013.01); *G11C 13/0069* (2013.01); *G11C 13/0097* (2013.01); *H01L 27/2454* (2013.01); *H01L 45/085* (2013.01); *H01L 45/1233* (2013.01); *H01L 45/1266* (2013.01); *H01L 45/144* (2013.01); *H01L 45/145* (2013.01)

(58) Field of Classification Search
CPC ..................................................... H01L 27/249
See application file for complete search history.

(56) References Cited

U.S. PATENT DOCUMENTS

| 8,048,713 B2 | 11/2011 | Sousa et al. |
| 8,524,599 B2 | 9/2013 | Tang et al. |
| 9,082,965 B2 | 7/2015 | Dressler et al. |
| 2005/0226062 A1 | 10/2005 | Aratani et al. |

(Continued)

FOREIGN PATENT DOCUMENTS

JP 2014-036034 A 2/2014

OTHER PUBLICATIONS

Kurotsuchi, K., et al.; "2.8-GB/s-write and 670-MB/s-erase operations of a 3D vertical chain-cell type phase-change-memory array"; 2015 Symposium on VLSI Technology, Digest T92.

*Primary Examiner* — Mounir Amer
(74) *Attorney, Agent, or Firm* — Foley & Lardner LLP

(57) ABSTRACT

A semiconductor memory device according to the embodiment includes a first wiring, a second wiring, a resistance change film, a metal film, and a first film. The first wiring is provided between a first interlayer insulating film and a second interlayer insulating film. The second wiring is provided intersecting with the first wiring and extends in a first direction. The resistance change film is provided between the first wiring and the second wiring. The metal film is provided between the second wiring and the resistance change film. The first film is provided between the first wirings and includes chalcogen.

17 Claims, 23 Drawing Sheets

(56) References Cited

U.S. PATENT DOCUMENTS

| | | | |
|---|---|---|---|
| 2012/0091423 A1* | 4/2012 | Sumino | G11C 13/0002 257/4 |
| 2013/0037774 A1* | 2/2013 | Song | H01L 27/249 257/2 |
| 2014/0061577 A1* | 3/2014 | Kanno | H01L 45/04 257/5 |
| 2015/0340406 A1* | 11/2015 | Jo | H01L 45/141 29/604 |
| 2017/0012052 A1* | 1/2017 | Jang | H01L 27/11582 |

* cited by examiner

SEMICONDUCTOR MEMORY DEVICE

CROSS-REFERENCE TO RELATED APPLICATIONS

This application is based upon and claims the benefit of U.S. Provisional Patent Application No. 62/309,105, filed on Mar. 16, 2016, the entire contents of which are incorporated herein by reference.

BACKGROUND

Field

Embodiments described herein relate to a semiconductor memory device.

Description of the Related Art

As a memory that stores large capacity data for use, attention has been focused on such as a resistive random access memory (ReRAM: Resistive RAM) that is easily formed three-dimensionally. Such memory uses a variable resistive element as a storage element. As the variable resistive element, a Conduction Bridge RAM (CBRAM), a storage element that employs such as a chalcogenide compound and a metal oxide, a MRAM element that employs a resistance change by a tunnel magneto-resistance effect, a storage element that employs a conductive polymer (polymer ferroelectric RAM, PFRAM), and similar storage element are used.

DETAILED DESCRIPTION

A semiconductor memory device according to the embodiments includes a first wiring, a second wiring, a resistance change film, a metal film, and a first film. The first wiring is provided between a first interlayer insulating film and a second interlayer insulating film. The second wiring is provided intersecting with the first wiring and extends in a first direction. The resistance change film is provided between the first wiring and the second wiring. The metal film is provided between the second wiring and the resistance change film. The first film is provided between the resistance change film and the first wiring, and includes chalcogen.

Next, a description will be given of the semiconductor memory device according to the embodiments in detail with reference to the drawings. Here, these embodiments are only examples, and are not described for the purpose of limiting the present invention.

For example, the respective drawings of the semiconductor memory device used in the following embodiments are schematically illustrated. The thickness, the width, the ratio, and similar parameter of the layer are different from actual parameters.

In the following description, the first direction is a direction intersecting with a substrate surface, a second direction is a direction intersecting with the first direction (for example, parallel to the substrate surface), and a third direction is a direction intersecting with the first direction and the second direction (for example, parallel to the substrate surface). A direction going away from the substrate surface along the first direction is referred to as upper, and a direction approaching the substrate along the first direction is referred to as lower. In one configuration, a lower surface is a surface facing a substrate of the configuration, and an upper surface is a surface of an opposite side with respect to the substrate. Directions along the second direction and the third direction are referred to as side directions. Surfaces intersecting with the second direction and the third direction are referred to as side surfaces. A predetermined direction parallel to the substrate surface is referred to as an X direction, a direction parallel to the substrate surface and perpendicular to the X direction is referred to as a Y direction, and a direction perpendicular to the substrate surface is referred to as a Z direction. The following description will indicate a case where the first direction, the second direction, and the third direction respectively correspond to the Z direction, the X direction, and the Y direction. However, the first to the third directions may not correspond to the Z direction, the X direction, and the Y direction.

First Embodiment

[Configuration]

Figure 1:
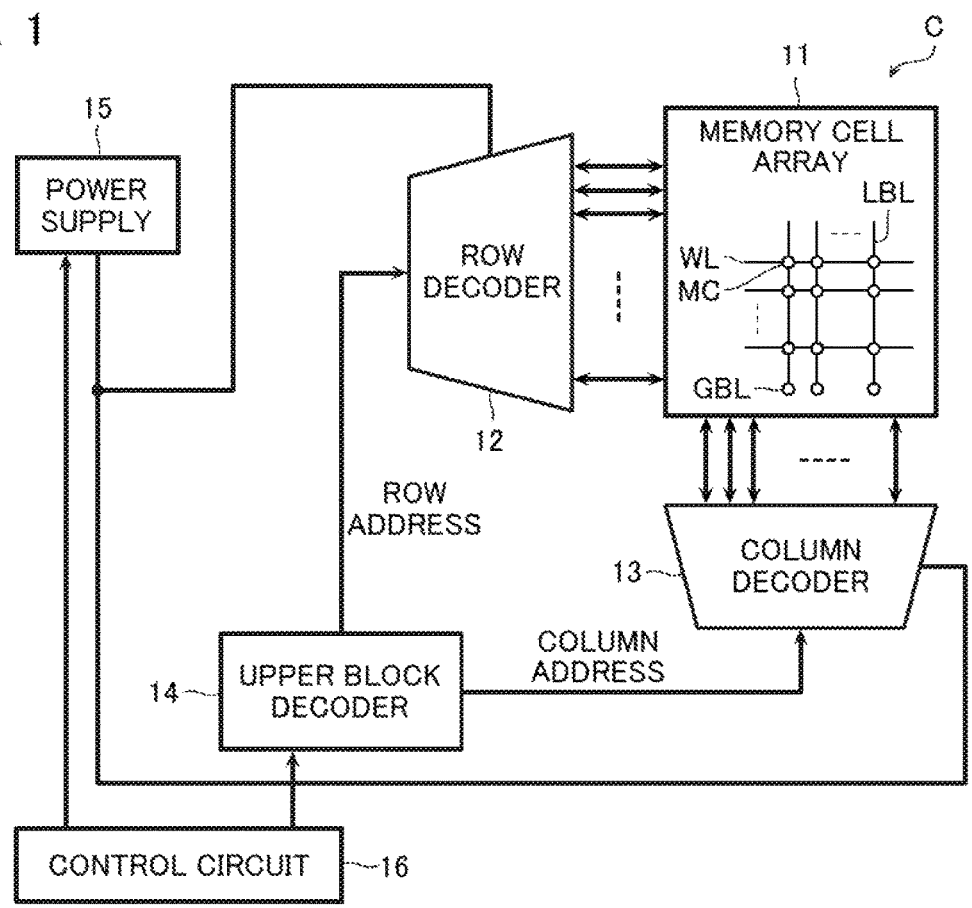
FIG. 1 is a block diagram illustrating a semiconductor memory device according to a first embodiment.

FIG. 1 is a block diagram illustrating a semiconductor memory device according to a first embodiment. Here, the semiconductor memory device means, for example, a chip C that stores user data, an electronic device that includes the chip C (such as a smart phone, a mobile phone, a tablet terminal, a music player, a wearable device), or the like. The user data is data to express, for example, contents used by a user (such as a character string, an audio, an image and a moving image), which are expressed by combinations of "0" and "1."

The chip C includes a memory cell array 11, a row decoder 12, a column decoder 13, an upper block decoder 14, a power supply 15, and a control circuit 16.

The memory cell array 11 includes a plurality of memory cells MC that store data of 1 bit or a plurality of bits. The memory cell array 11 is configured such that an access (data erasure/writing/reading) to a desired memory cell MC can be performed by applying a predetermined voltage to desired global bit line GBL and word line WL corresponding to address data.

The row decoder 12 selects one word line WL corresponding to a row address for access to apply the predetermined voltage.

The column decoder 13 selects one or a plurality of global bit lines GBL corresponding to a column address for access to apply a predetermined voltage. The column decoder 13 includes a sense amplifier circuit for detecting the current or the voltage of the global bit line GBL to determine the user data recorded on the memory cell MC.

The upper block decoder 14 generates the row address and the column address corresponding to the address data to supply to the row decoder 12 and the column decoder 13. The power supply 15 generates combinations of the predetermined voltages corresponding to each operation of data erasure/writing/reading to supply to the row decoder 12 and the column decoder 13.

The control circuit 16 accepts external control signals from an external host (not illustrated) to control such as the upper block decoder 14 and the power supply 15.

Figure 2:
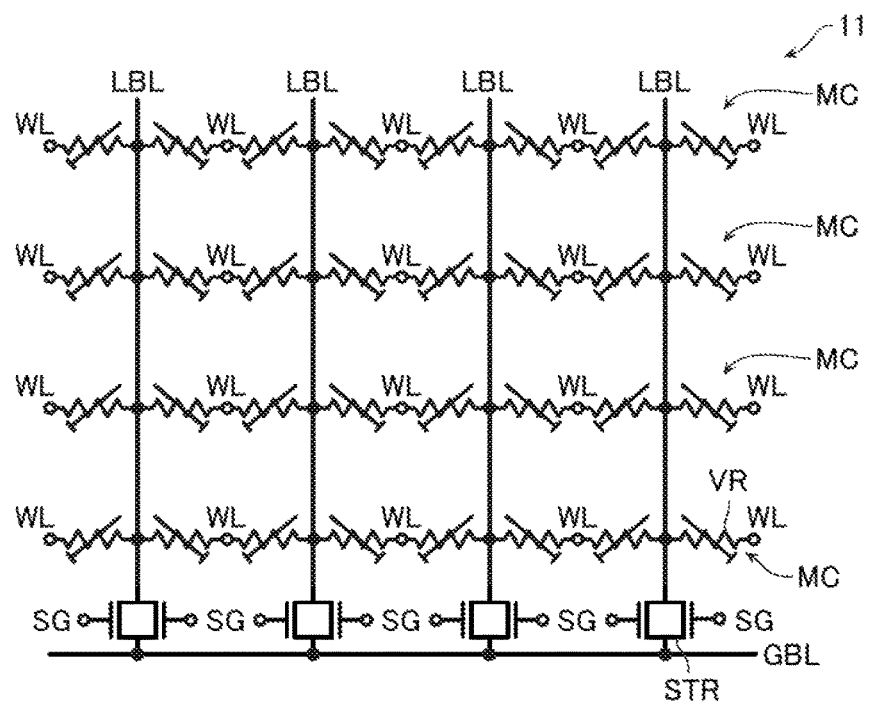
FIG. 2 is a circuit diagram illustrating a memory cell array of the semiconductor memory device.

FIG. 2 is a circuit diagram of the memory cell array 11.

The memory cell array 11 includes a plurality of word lines WL (first wiring), a plurality of local bit lines LBL (second wiring), and a plurality of memory cells MC connected between the word lines WL and the local bit lines LBL. The memory cell array 11 includes the global bit lines GBL and a plurality of select gate transistors STR connected between the global bit lines GBL and the plurality of the local bit lines LBL. The select gate transistor STR includes gate electrodes to which a select gate line SG is connected.

As described above, the memory cell MC stores the data of 1 bit or the plurality of bits. The memory cell MC includes a variable resistive element VR. For example, when the variable resistive element VR is in a low resistance state, the memory cell MC records "1," and when in a high resistance state, the memory cell MC records "0."

Figure 3:
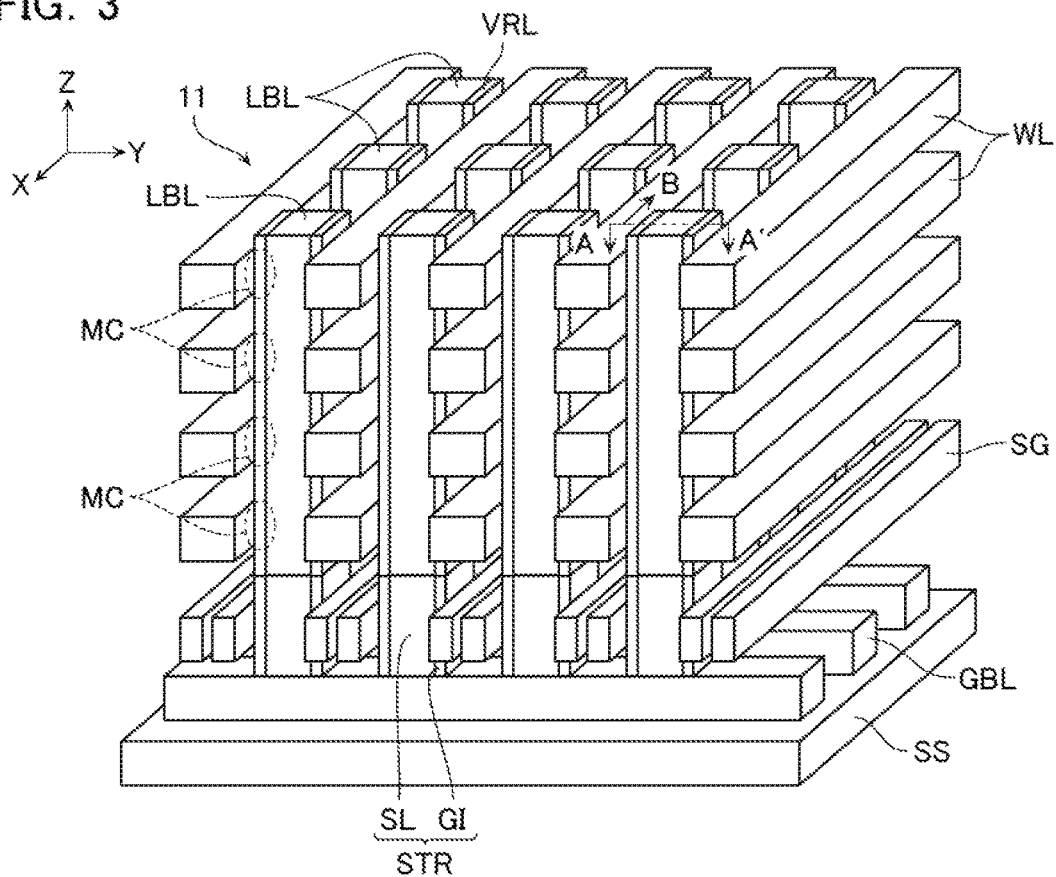
FIG. 3 is a schematic perspective view illustrating the memory cell array.

FIG. 3 is a schematic perspective view illustrating a part of the configuration of the memory cell array 11. FIG. 3 is a drawing for describing a three-dimensional structure of the wiring, the memory cells MC, and similar part. Then, such as the interlayer insulating films provided between such as the wirings are not illustrated. FIG. 3 is a drawing for an explanation. Then, the specific configuration may be changed as necessary.

FIG. 3 illustrates a substrate SS. Above the substrate SS, as described with reference to FIG. 2, the word lines WL (first wiring), the local bit lines LBL (second wiring), the memory cells MC, the global bit lines GBL, the select gate transistors STR, and the select gate lines SG are provided.

The substrate SS is a semiconductor substrate including a semiconductor such as silicon. An upper surface of the substrate SS is, for example, a planar surface extending in the X direction and the Y direction.

The word line WL extends in the X direction, and a plurality of the word lines WL are provided in the Y direction and the Z direction. The word line WL includes a conductive material such as tungsten (W).

The local bit line LBL extends in the Z direction, and a plurality of the local bit lines LBL are provided in the X direction and the Y direction. The local bit line LBL includes a conductive material such as tungsten (W).

The memory cell MC is constituted of a memory film VRL. The memory film VRL according to the embodiment extends in the Z direction along a side surface of the local bit line LBL in the Y direction, and provided between the local bit line LBL and the plurality of the word lines WL. The memory cell MC is a part of the memory film VRL positioned between the word line WL and the local bit line LBL.

The global bit line GBL extends in the Y direction, and a plurality of the global bit lines GBL are provided in the X direction. The global bit line GBL includes a conductive material such as tungsten (W).

A plurality of the select gate transistors STR are provided in the X direction and the Y direction. The select gate transistor STR includes a semiconductor layer SL and a gate insulating film GI provided on a side surface of the semiconductor layer SL in the Y direction. A lower end of the semiconductor layer SL is connected to the global bit line GBL. An upper surface of the semiconductor layer SL is connected to a lower end of the local bit line LBL. Both side surfaces of the semiconductor layer SL in the Y direction faces a pair of select gate lines SG via the gate insulating films GI.

The select gate line SG extends in the X direction, and a plurality of the select gate lines SG are provided in the Y direction. Two select gate lines SG are provided between a pair of select gate transistors STR adjacent one another in the Y direction.

Figure 4:
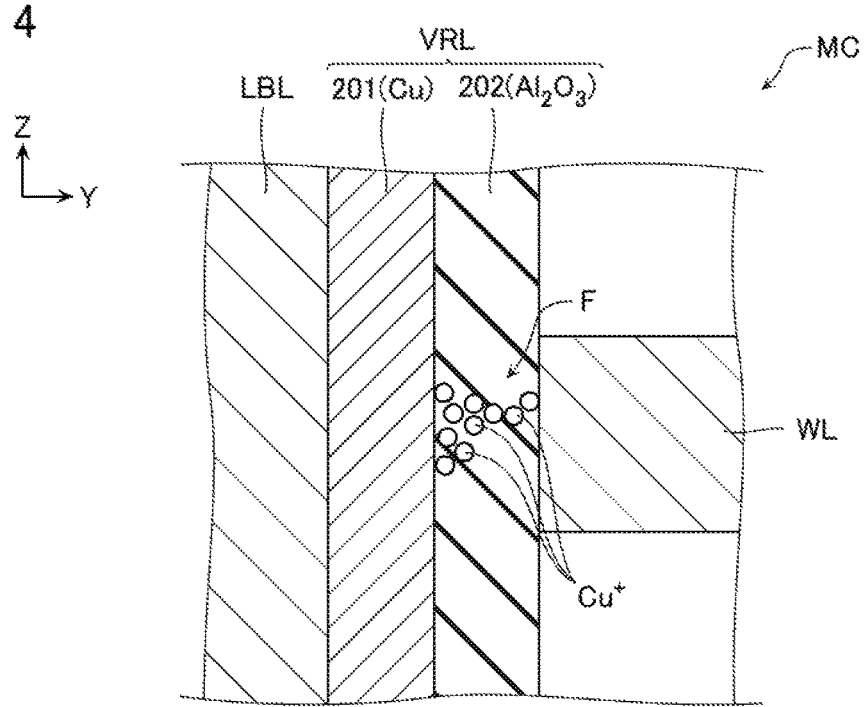
FIG. 4 is a schematic cross-sectional view illustrating a memory cell of the semiconductor memory device.

FIG. 4 is a cross-sectional view illustrating a configuration of the memory cell MC. In FIG. 4, the interlayer insulating films provided between the likes of the wirings or the like are not illustrated.

The memory film VRL includes a metal film 201 and a resistance change film 202. The metal film 201 is a metal that is easily ionized and repeatedly movable in the resistance change film 202. The metal film 201 is such as copper (Cu). The metal to be ionized is not limited to copper. The metal film 201 may be silver (Ag). The resistance change film 202 is a film where the metal moved from the metal film 201 forms a filament. The resistance change film 202 includes a material with a high resistivity compared with the metal or an insulating material in which the above-described metal can diffuse. For example, the resistance change film 202 is constituted of silicon oxide ($SiO_2$). Note that, the material of the resistance change film 202 is not limited to silicon oxide. The material included by the resistance change film 202 includes, for example, a material including silicon such as silicon oxynitride (SiON), and a transition metal oxide such as hafnium oxide ($HfO_x$), hafnium silicon oxide ($HfSiO_x$), hafnium silicon oxynitride (HfSiON), aluminum oxide ($AlO_x$), hafnium aluminum oxide ($HfAlO_x$), and zirconium oxide ($ZrO_x$). The resistance change film 202 is not limited to a single layer structure. The resistance change film 202 may be a film with a laminated structure of two or more layers. For example, the resistance change film 202 may be a laminated structure including films including different materials including silicon, or a laminated structure of a film including a material including silicon and a film including a transition metal oxide. In the first embodiment, a description will be given with an example of the resistance change film 202 constituted of alumina ($Al_2O_3$).

An electrically conductive filament F formed in the resistance change film 202 includes such as copper ions $Cu^+$ supplied to the resistance change film 202 from the metal film 201. The memory cell MC is in a low resistance state when the move of the copper ions $Cu^+$ causes the filament F to reach the word line WL, and in a high resistance state when a part of the filament F disappears. Hereinafter, an operation that causes the memory cell MC to transition from the high resistance state to the low resistance state is referred to as a setting operation, and an operation that causes the memory cell MC to transition from the low resistance state to the high resistance state is referred to as a reset operation.

In the setting operation, the voltage is applied such that the local bit line LBL has a high electric potential and the word line WL has a low electric potential. This ionizes copper in the metal film 201 to copper ion $Cu^+$ to move toward the word line WL as a negative electrode. The copper ions $Cu^+$ bind to electrons supplied from the word line WL in the resistance change film 202 to form the filament F in the resistance change film 202. When the filament F in the memory cell MC reaches the word line WL, the filament F acts as a current path to cause the memory cell MC to be in the low resistance state.

In the reset operation, the voltage is applied such that the local bit line LBL has a low electric potential and the word line WL has a high electric potential. This returns the copper ions $Cu^+$ to the metal film 201 to cause a part of the filament F to be disappeared. Then, the current path between the local bit line LBL and the word line WL disappears to cause the memory cell MC to be in the high resistance state.

Figure 5:
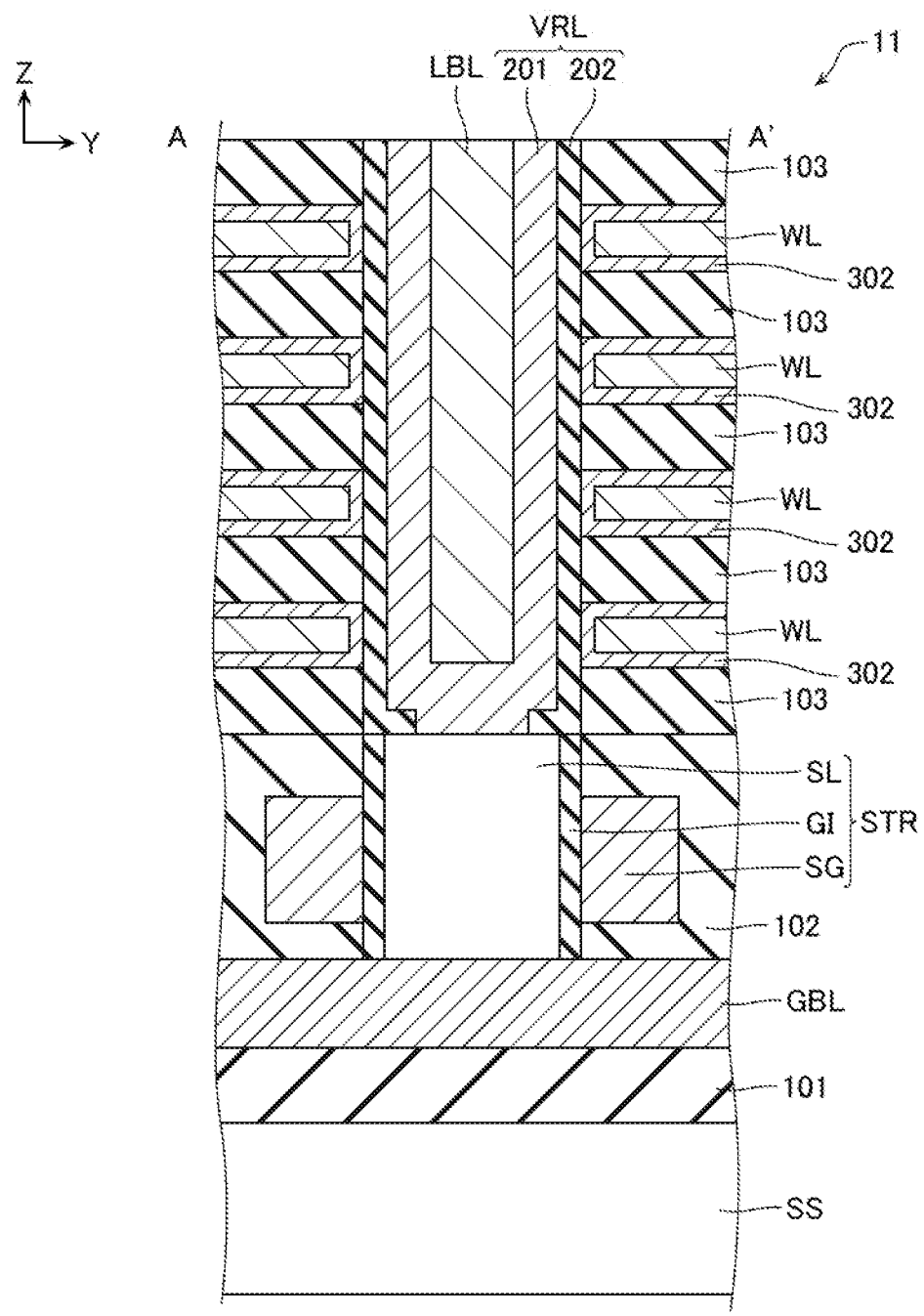
FIG. 5 is a cross-sectional view illustrating the memory cell array of the semiconductor memory device.

FIG. 5 is a cross-sectional view illustrating the configuration illustrated in FIG. 3 taken along a line A-A' viewing in a direction indicated by B in FIG. 3. In FIG. 5, insulating films 101 and 102, an interlayer insulating film 103, and a first film 302, which are omitted in FIG. 3 and FIG. 4, are illustrated.

The insulating film 101 is provided on the upper surface of the substrate SS. On the upper surface of the insulating film 101, the global bit line GBL is provided. The substrate SS includes a semiconductor such as silicon (Si). The insulating film 101 is constituted of an insulating film such as silicon oxide ($SiO_2$). The global bit line GBL is constituted of a conductive film such as tungsten (W). The global bit line GBL may include such as titanium nitride (TiN) on the lower surface.

On the upper surface of the global bit line GBL, the semiconductor layer SL is provided. The semiconductor layer SL extends in the Z direction. On the side surface of the semiconductor layer SL in the Y direction, the gate insulating film GI and the select gate line SG are provided. On the upper surface of the global bit line GBL, and the upper surface, the lower surface, and the side surface in the Y direction of the select gate line SG, the insulating film 102 is provided. The semiconductor layer SL is constituted of a semiconductor layer such as polysilicon. The gate insulating film GI and the insulating film 102 are constituted of an insulating film such as silicon oxide ($SiO_2$). The select gate line SG is constituted of a conductive film such as tungsten (W).

On the upper surface of the insulating film 102, the word line WL and the interlayer insulating film 103 are laminated in alternation in the Z direction. The word line WL is adjacent to the interlayer insulating film 103 in the Z direction. The word line WL is constituted of a conductive film such as tungsten (W). The interlayer insulating film 103 is constituted of an insulating film such as silicon oxide ($SiO_2$). The interlayer insulating film 103 may be constituted of a material identical to the insulating film 101 and/or the insulating film 102, or may be constituted of a material different from the insulating film 101 and/or the insulating film 102. On a surface of the word line WL where the word line WL and the interlayer insulating film 103 are adjacent to one another and a surface of the word line WL where the word line WL and the resistance change film 202 are adjacent to one another, a barrier metal film of such as titanium nitride (TiN) may be provided.

On the side surfaces of the plurality of the word lines WL and the interlayer insulating films 103 in the Y direction, and on the upper surface of the semiconductor layer SL, the memory film VRL is provided. The memory film VRL includes the resistance change film 202 and the metal film 201. The resistance change film 202 is provided on the side surfaces of the plurality of the word lines WL and the interlayer insulating films 103 in the Y direction. The metal film 201 is provided on the side surface of the resistance change film 202 in the Y direction and the upper surface of the semiconductor layer SL. The metal film 201 is constituted of a metal film of such as silver (Ag) or copper (Cu). The resistance change film 202 includes an oxide such as alumina ($Al_2O_3$) or silicon oxide ($SiO_2$). Note that, it is enough for the resistance change film 202 to include oxygen. Then, the resistance change film 202 may be constituted of mainly such as silicon nitride ($Si_3N_4$) and silicon oxynitride (SiON). The barrier metal film of such as titanium nitride (TiN) may be provided between the metal film 201 and the resistance change film 202.

The local bit line LBL extends in the Z direction along the side surface of the metal film 201 in the Y direction. The local bit line LBL is constituted of a conductive film of such as tungsten (W). The barrier metal film of such as titanium nitride (TiN) may be provided between the local bit line LBL and the metal film 201.

Here, the semiconductor memory device according to the embodiment includes the first film 302 provided between the word line WL and the resistance change film 202. The first film 302 is also provided between the word line WL and the interlayer insulating film 103. A plurality of the first films 302 corresponding to the plurality of the word lines WL are provided. In other words, the plurality of the first films 302 are separated in the Z direction and apart from one another. The first film 302 includes chalcogen. A thickness of the first film 302 according to the embodiment is, for example, approximately 3 to 10 nm. In the following description, any word line WL is occasionally referred to as "a first wiring," and another word line WL adjacent to the word line WL in the Z direction is occasionally referred to as "a third wiring." The first film 302 provided between the other word line WL (the third wiring) and the resistance change film 202 is occasionally referred to as "a second film." In the embodiment, the "second film" is apart from "the first film."

Here, chalcogen includes elements belonging to a group 16 of the periodic table excluding oxygen (O). For example, chalcogen is such as sulfur (S), selenium (Se), tellurium (Te). A compound including chalcogen is referred to as chalcogenide. Chalcogenide is such as GeSbTe, GeTe, SbTe, and SiTe.

[Effects]

Figure 6:
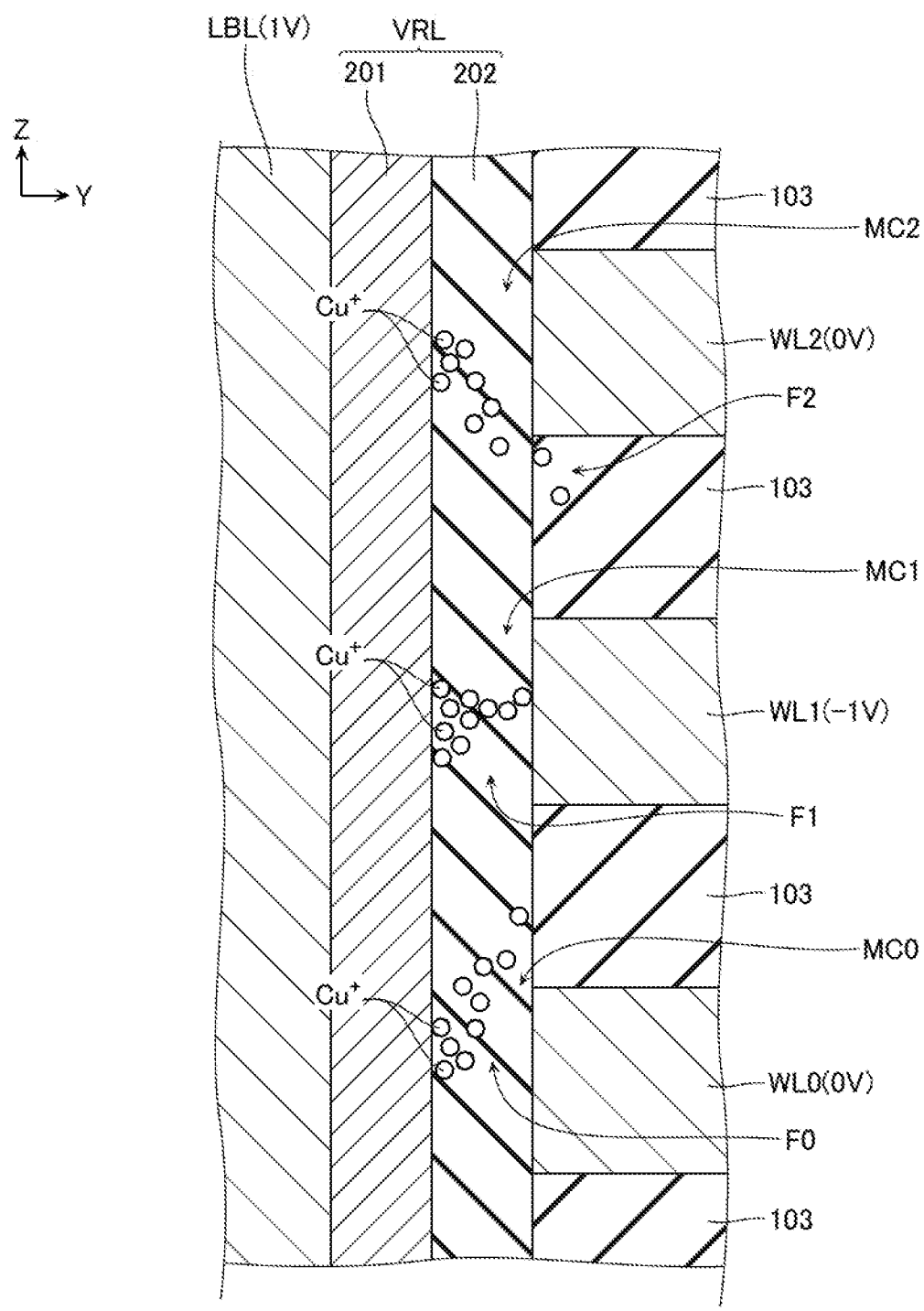
FIG. 6 is a cross-sectional view illustrating a part of a semiconductor memory device according to a comparative example.

As illustrated in FIG. 6, when the setting operation is performed to a selected memory cell MC1, for example, the voltage of 1 V is applied to the local bit line LBL, voltage of −1 V is applied to the selected word line WL1, voltage of 0 V is applied to the non-selected word line WL0, and voltage of 0 V is applied to the non-selected word line WL2. This causes metal atoms included in the metal film 201 to have positive ions to move toward the selected word line WL1 as a negative electrode. Then, in the resistance change film 202, the metal atoms bind to electrons supplied from the selected word line WL1 to form the filament F1 in the resistance change film 202. The filament F1 in the selected memory cell MC1 reaches the selected word line WL1. The filament F acts as the current path to cause the selected memory cell MC1 to be in the low resistance state.

Here, between the selected word line WL1, and the non-selected word lines WL0 and WL2, the potential difference of 1 V has been occurred. Therefore, the copper ions $Cu^+$ constituting a filament F0 in an adjacent memory cell MC0 adjacent to the selected memory cell MC1 move in the direction of the selected memory cell MC1. This possibly causes the filament F0 to disappear.

Additionally, in a state where the local bit line LBL is positively charged, the copper ions $Cu^+$ move in the direction away from the local bit line LBL. Depending on the potential difference between the word lines WL, the copper ions $Cu^+$ constituting a filament F2 in the non-selected memory cell MC2 enters into the interlayer insulating film 103 to chemically bind to the interlayer insulating film 103. If an electric field is applied between the wirings in this state, the copper ions $Cu^+$ spread in the interlayer insulating film 103 while replacing the binding. This possibly causes a breakdown voltage failure between the wirings. That is, the existence of the potential difference between the adjacent wirings causes a current leakage between the wirings. This possibly makes difficult for the wirings to be applied an appropriate electric field.

Figure 7:
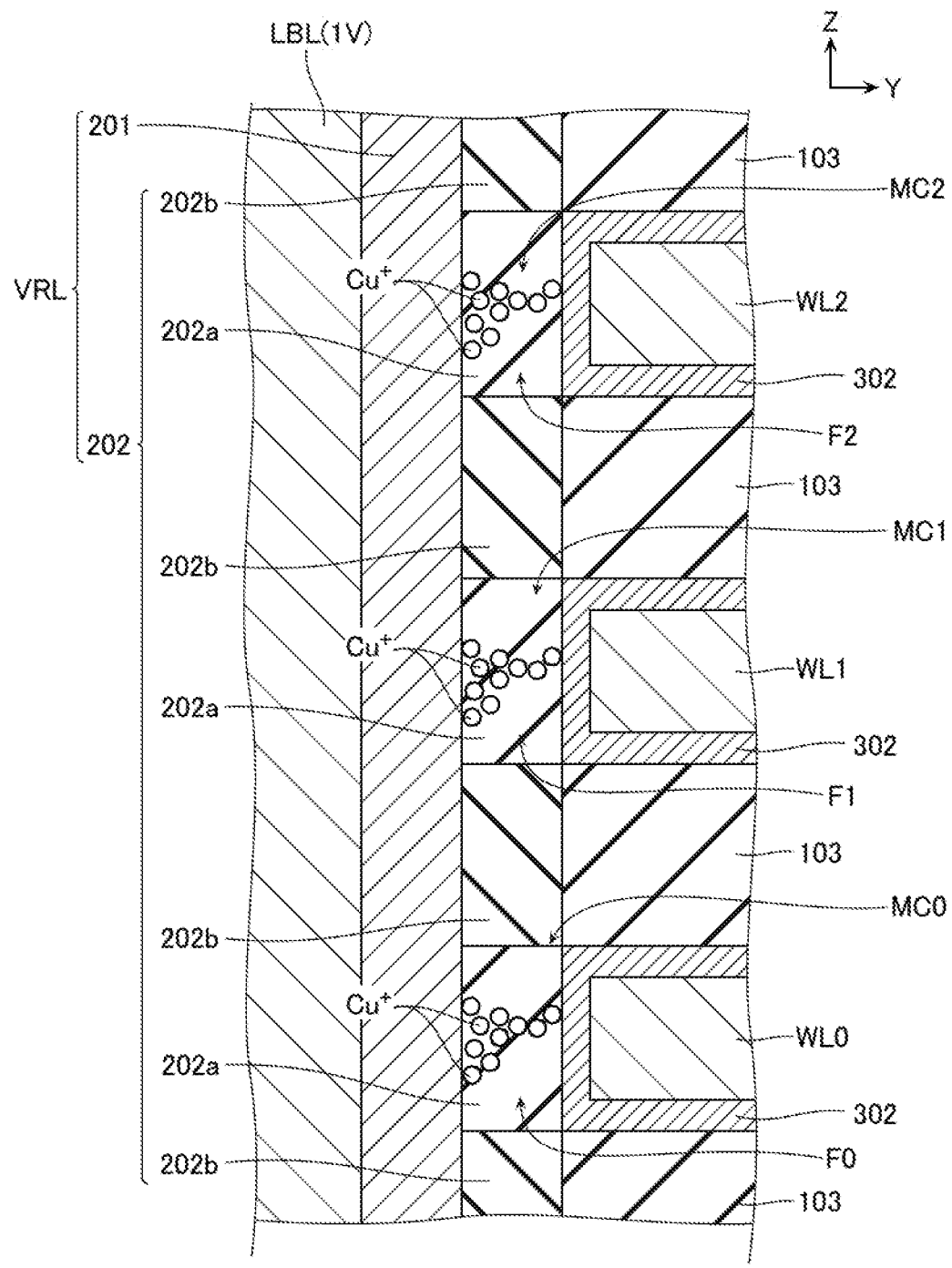
FIG. 7 is an enlarged view of FIG. 5.

Therefore, according to the embodiment, as illustrated in FIG. 7, the first film 302 including chalcogen is provided on the side surface of the resistance change film 202 in the Y direction. The first film 302 includes chalcogen and contacts with the resistance change film 202. The resistance change film 202 is such as alumina ($Al_2O_3$), a metal oxide film or a silicon oxide film. Here, if the chalcogenide contacts with the oxide, oxygen in the oxide is replaced to chalcogen atom. This causes a part of the resistance change film 202 (202a of FIG. 7) to be chalcogenide with a low resistance value compared with the metal oxide film with a high resistance. Then, the resistance value can be reduced and the voltage required for the setting operation and the reset operation can be reduced. This reduces the operating voltage to suppress that the filament F0 in the adjacent memory cell MC0 disappears or that the copper ions $Cu^+$ enter into the interlayer insulating film 103 as described with reference to FIG. 6.

As illustrated in FIG. 7, in the resistance change film 202, if a part positioned between the word line WL and the local bit line LBL is assumed to be a first part 202a (first resistance change film), and a part positioned between the interlayer insulating film 103 and the local bit line LBL is assumed to be a second part 202b (second resistance change film), the first film 302 is provided between the first part 202a and the word line WL. Therefore, according to the embodiment, a resistance value of the first part 202a can be selectively lowered. This suppresses that the copper ions $Cu^+$ move to the second part 202b while reducing the voltage required for the setting operation and the reset operation.

According to the embodiment, for example, the interlayer insulating film 103 includes silicon oxide ($SiO_2$), and the resistance change film 202 includes alumina ($Al_2O_3$). Here, the alumina provided on the sidewall is a low density film compared with the interlayer insulating film 103. If the resistance change film 202 and the interlayer insulating film 103 are identical silicon oxide film, the resistance change film 202 is preferred to be a silicon oxide film of the low density compared with the interlayer insulating film 103. In such aspect, the replacement of oxygen by chalcogen atoms easily occurs in the resistance change film 202 including alumina compared with in the interlayer insulating film 103 including silicon oxide. Therefore, by forming the interlayer insulating film 103 of silicon oxide and forming the resistance change film 202 of alumina, the insulation property of the interlayer insulating film 103 can be secured while reducing the resistance of the resistance change film 202.

[Manufacturing Method]

FIG. 8 to FIG. 14 are cross-sectional views illustrating manufacturing processes of the semiconductor memory device according to the embodiment. FIG. 8 to FIG. 14 correspond to the cross section illustrated in FIG. 5.

Figure 8:
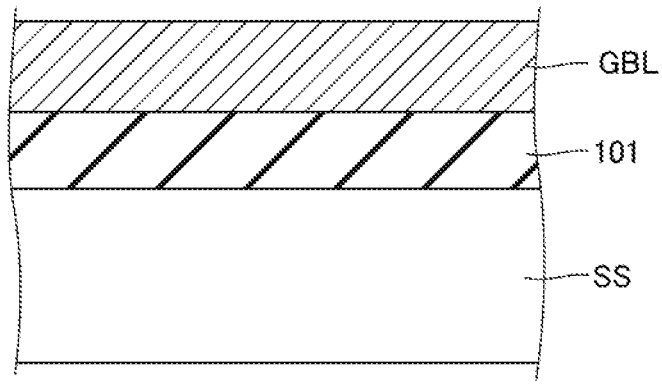
FIG. 8 to FIG. 14 are cross-sectional views illustrating manufacturing processes of the semiconductor memory device according to the first embodiment.

As illustrated in FIG. 8, in the manufacturing method for the semiconductor memory device, first, the insulating film 101 including such as silicon oxide ($SiO_2$) is formed on the substrate SS including such as silicon (Si), and on the insulating film 101, the global bit line GBL is formed. The global bit line GBL is formed by a method such as Chemical Vapor Deposition (CVD), performed a patterning by a method such as a photolithography, and processed by a method such as an etching.

Figure 9:
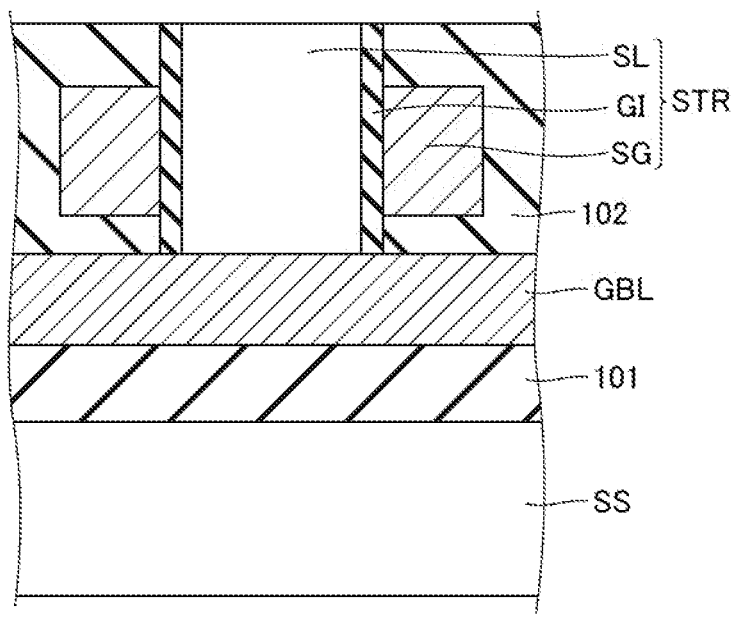

Next, as illustrated in FIG. 9, on the upper surface of the global bit line GBL, the semiconductor layer SL including a semiconductor such as polysilicon is formed, on the side surface of the semiconductor layer SL in the Y direction, the gate insulating film GI including such as silicon oxide ($SiO_2$) is formed and the insulating film 102 and the select gate line SG is formed. The semiconductor layer SL, the gate insulating film GI, the insulating film 102, and the select gate line SG are formed by the method such as the CVD, the photolithography, and the etching.

Figure 10:
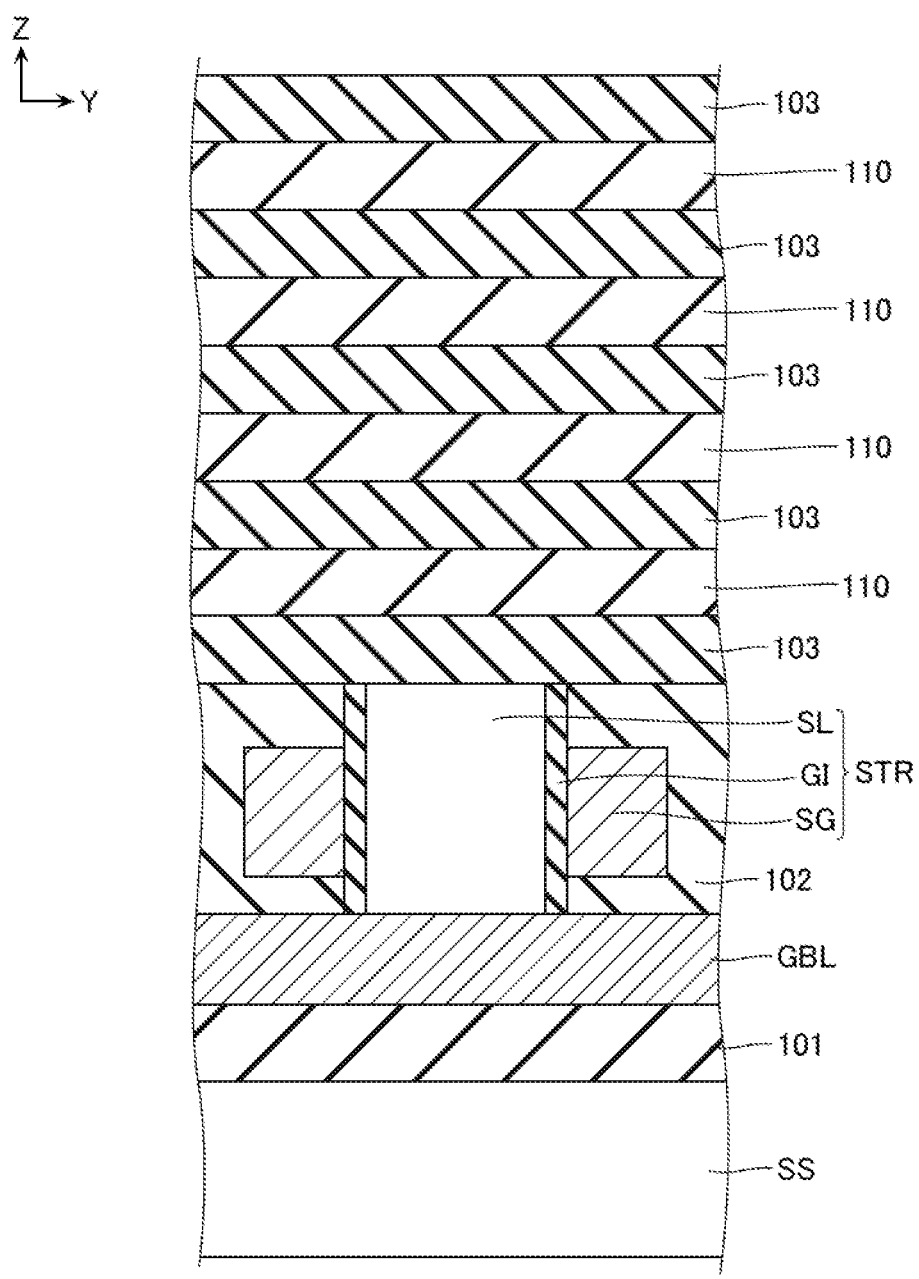

Next, as illustrated in FIG. 10, on the upper surfaces of the semiconductor layer SL and the insulating film 102, the interlayer insulating films 103, which include such as silicon oxide ($SiO_2$), and sacrificial films 110, which include such as silicon nitride ($Si_3N_4$), are alternately formed. The interlayer insulating film 103 and the sacrificial film 110 are formed by the method such as the CVD.

Figure 11:
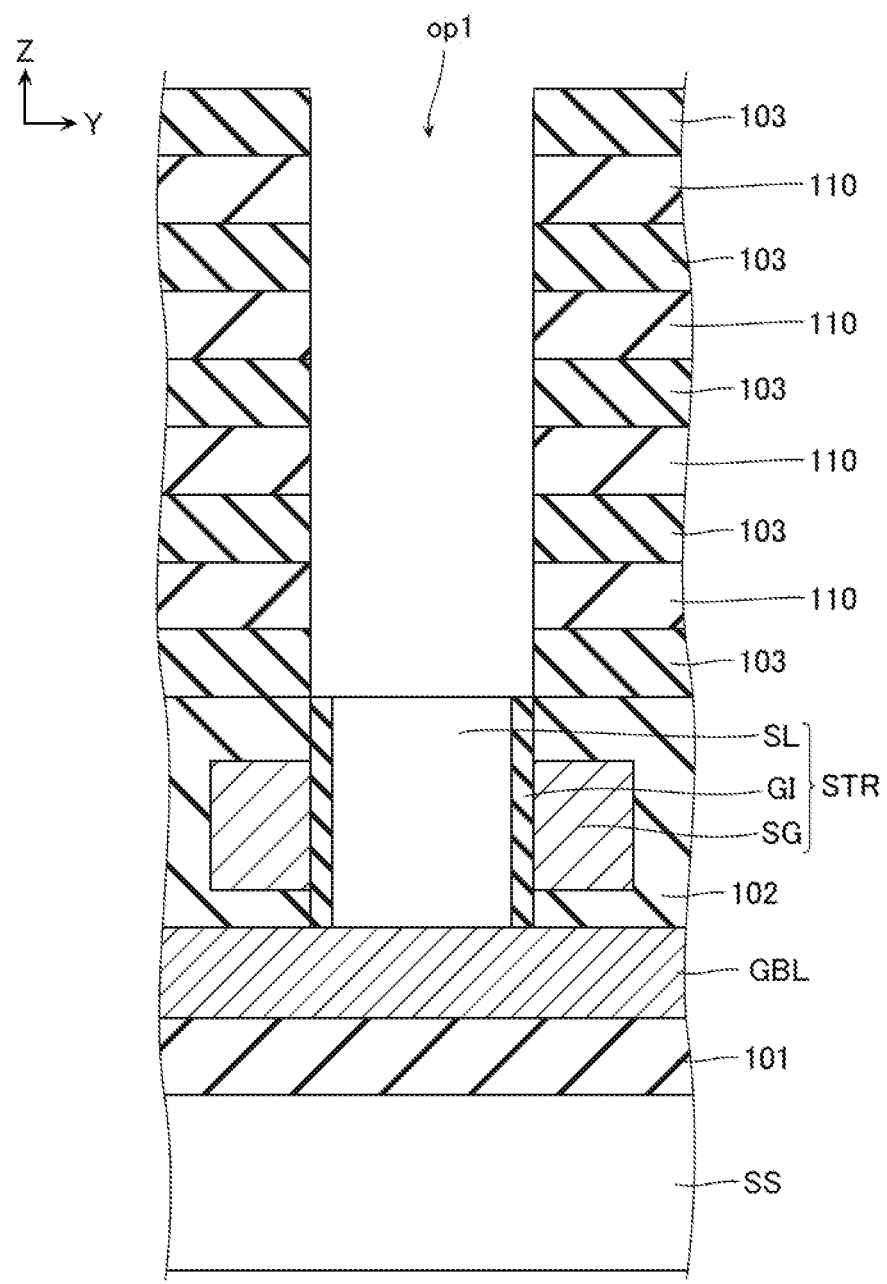

Next, as illustrated in FIG. 11, an opening op1 is formed. The opening op1 extends in the Z direction, and separates the plurality of the interlayer insulating films 103 and the sacrificial films 110 in the Y direction to expose the upper surface of the semiconductor layer SL. The opening op1 is formed by the method such as Reactive Ion Etching (RIE).

Figure 12:
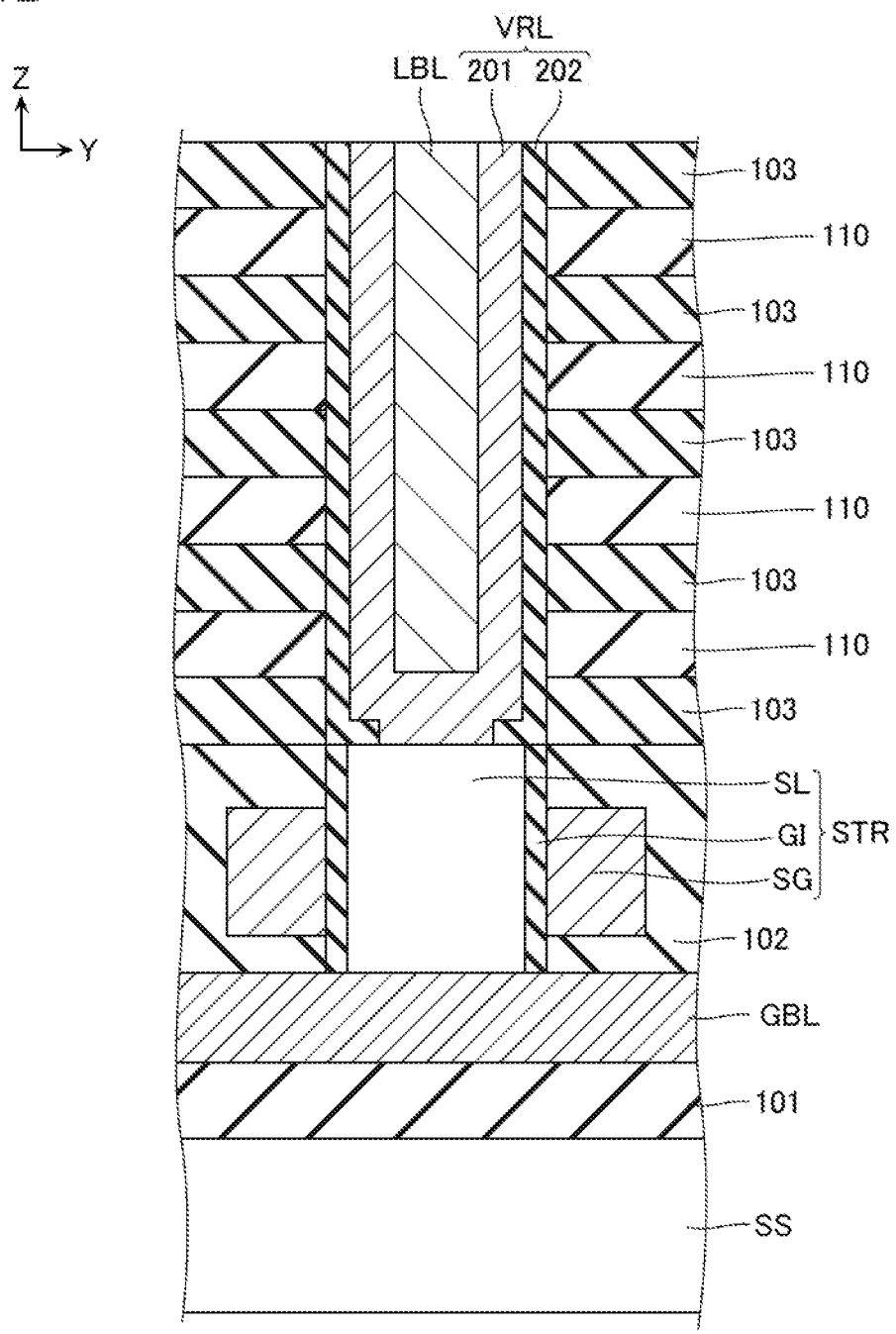

Next, as illustrated in FIG. 12, the resistance change film 202, which includes such as alumina ($Al_2O_3$), is formed on the side surfaces of the plurality of the interlayer insulating films 103 and the sacrificial films 110 in the Y direction, which are exposed to the opening op1. Then, the metal film 201, which includes such as copper (Cu), and the local bit line LBL, which includes such as tungsten (W), are formed in the order on the side surfaces of the resistance change film 202 in the Y direction and on the upper surface of the semiconductor layer SL. The resistance change film 202, the metal film 201 and the local bit line LBL are formed by the method such as the CVD and RIE.

Figure 13:
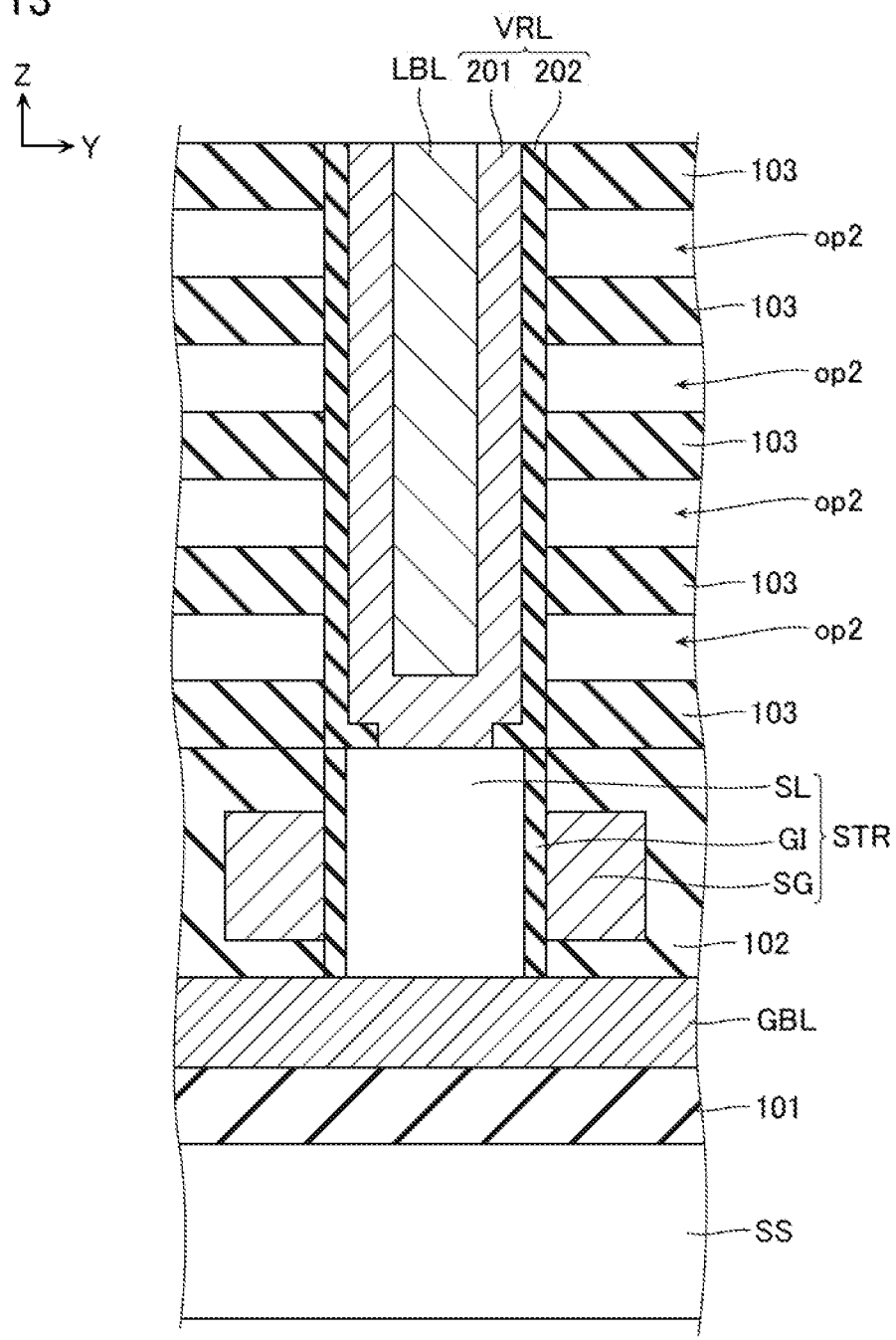

Next, as illustrated in FIG. 13, the sacrificial film 110 is removed. The sacrificial film 110 is removed by the method such as the wet etching using phosphorus acid. The removal of the sacrificial film 110 generates an opening op2 to which the side surface of the resistance change film 202 in the Y direction exposes.

Figure 14:
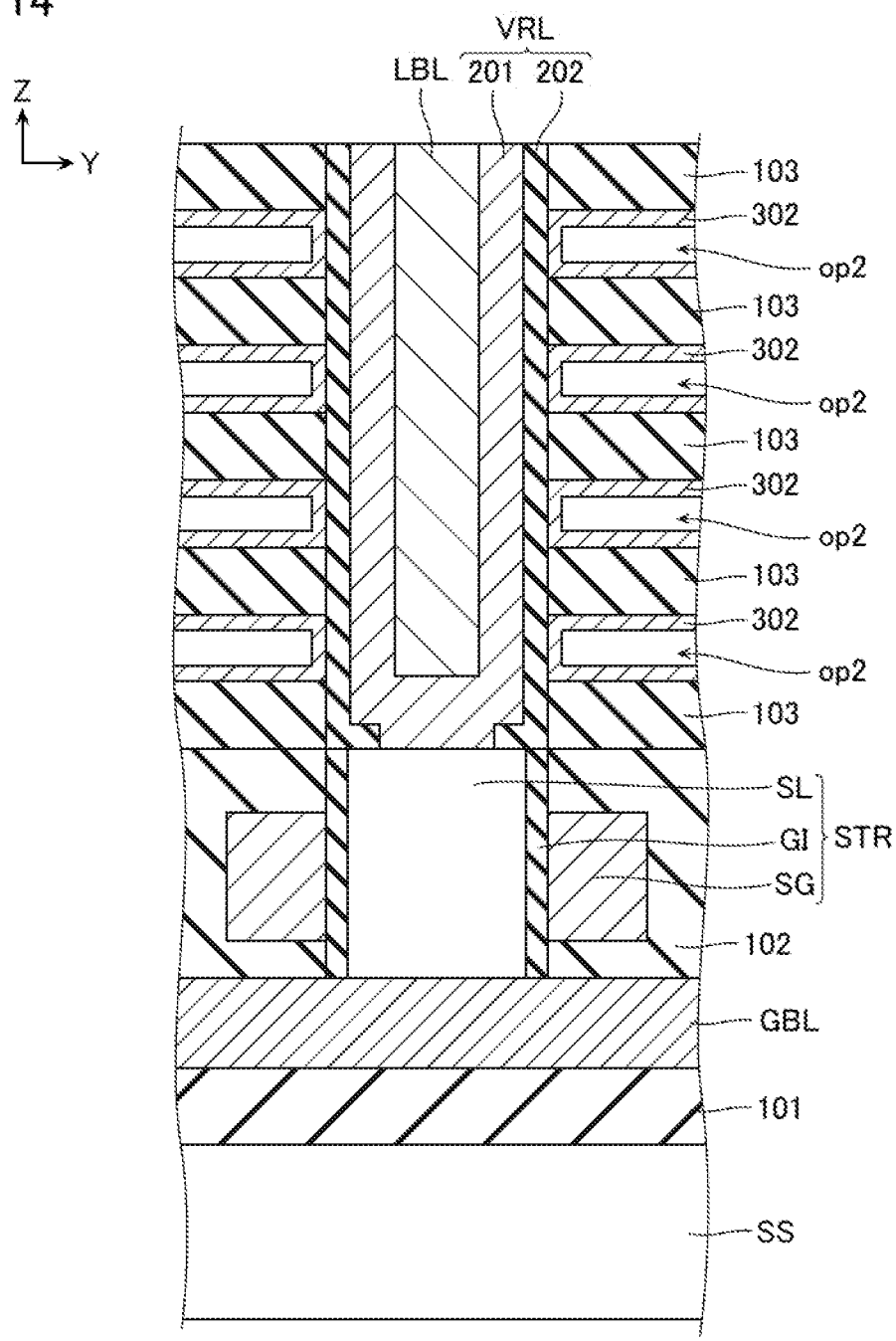

Next, as illustrated in FIG. 14, the first film 302 is formed on the side surface of the resistance change film 202 in the Y direction and the upper and lower surfaces of the interlayer insulating film 103 via the opening op2. The first film 302 includes the above-described chalcogen. The first film 302 is formed by the method such as the CVD or Atomic Layer Deposition (ALD).

Next, as illustrated in FIG. 5, the word line WL, which includes as tungsten (W), is formed on an inner wall of the first film 302 via the opening op2. By doing this, the semiconductor memory device described with reference to FIG. 5 can be manufactured.

Second Embodiment

Figure 15:
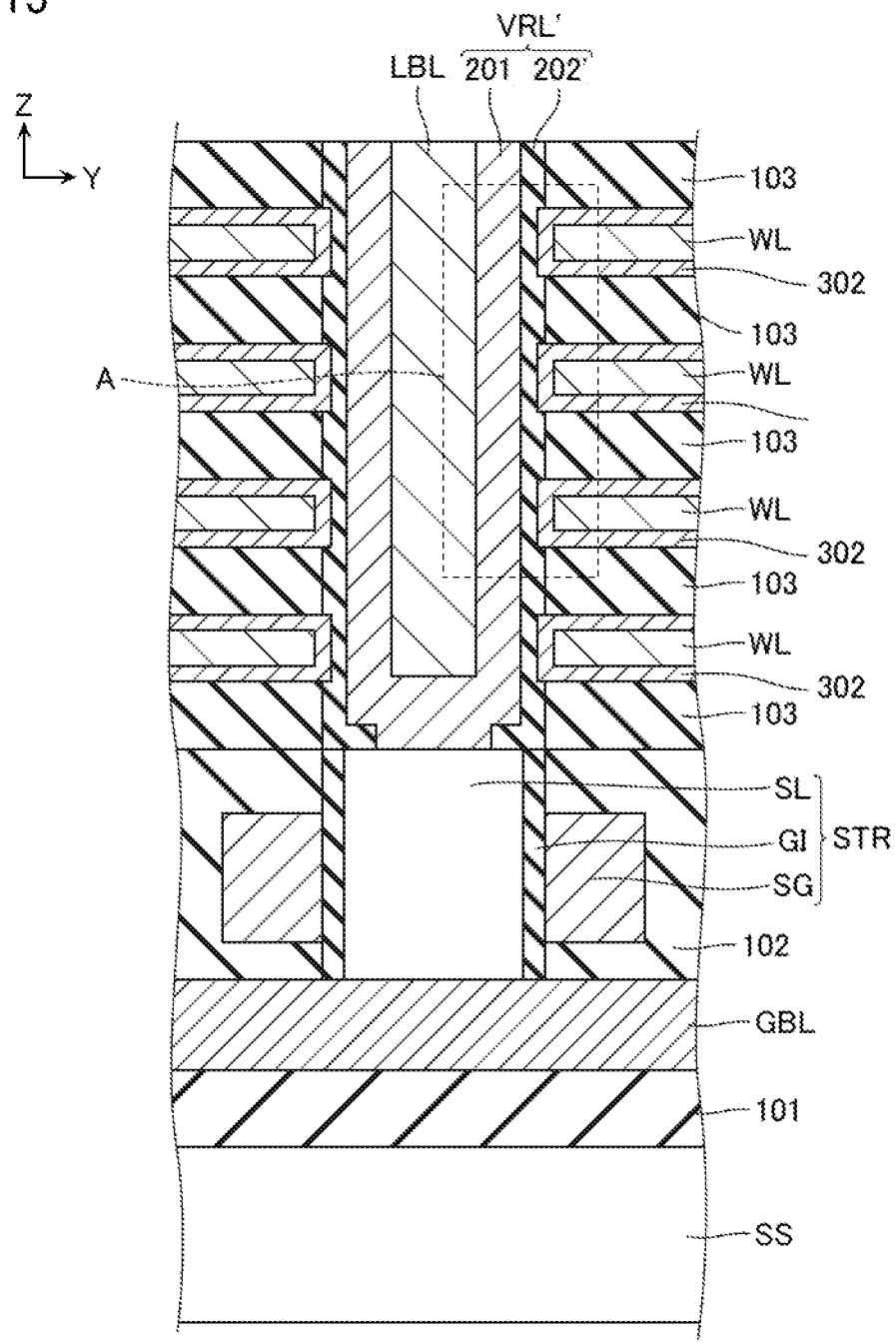
FIG. 15 is a cross-sectional view illustrating a memory cell array of a semiconductor memory device according to a second embodiment.
Figure 16:
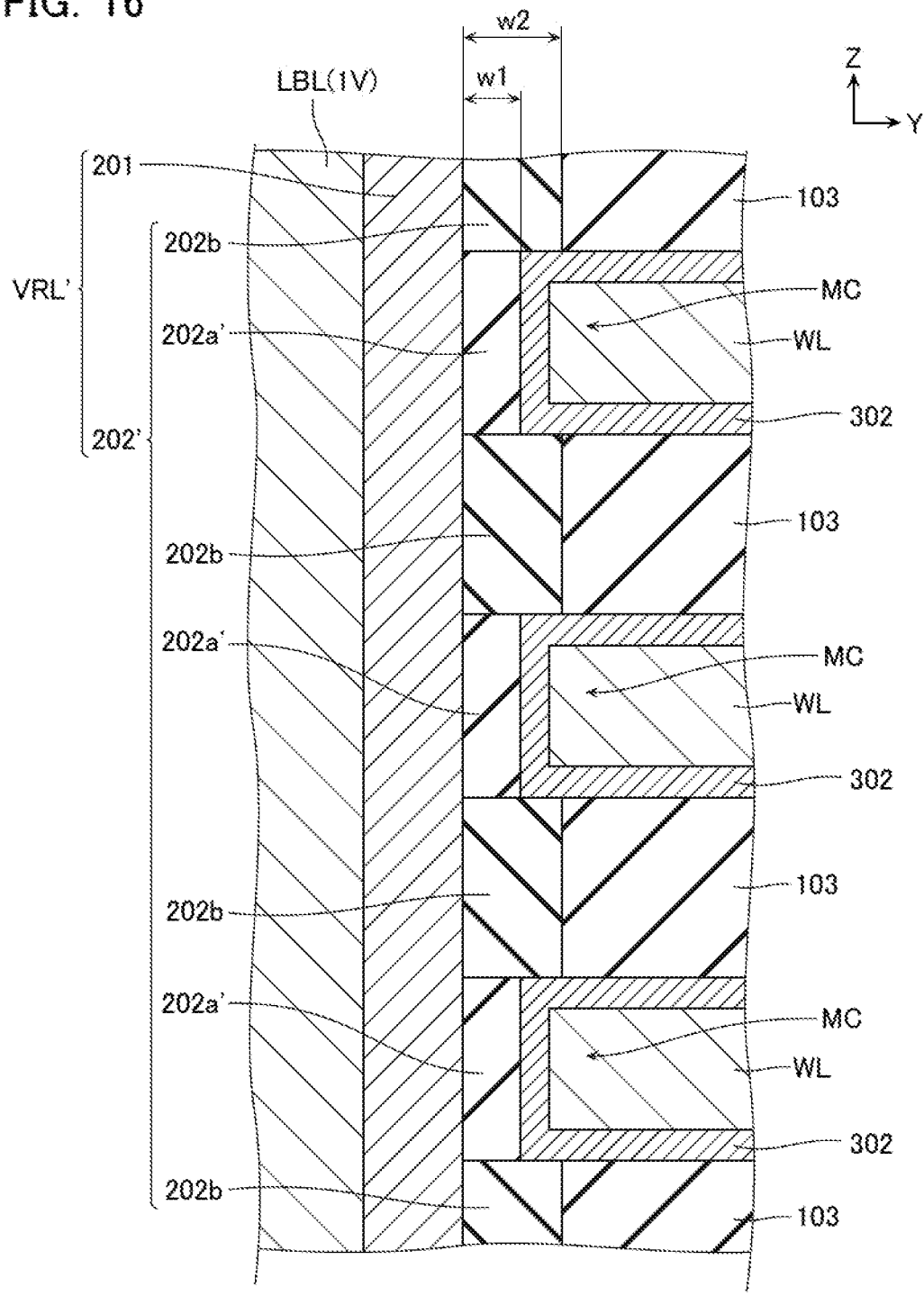
FIG. 16 is an enlarged view of FIG. 15.

FIG. 15 is a cross-sectional view illustrating a part of a configuration of a semiconductor memory device according to a second embodiment. FIG. 16 is an enlarged view illustrating a part indicated by A in FIG. 15. In the following description, like reference numerals designate elements corresponding or identical to the elements in the first embodiment, and therefore such elements will not be further elaborated here.

As illustrated in FIG. 15, while the semiconductor memory device according to the second embodiment is configured basically similar to the first embodiment, a resistance change film 202' in the memory film VRL has a configuration different from the first embodiment.

As illustrated in FIG. 16, in the resistance change film 202', a film thickness w1 of a first part 202a' constituting a part of the memory cell MC is smaller than a film thickness w2 of the second part 202b positioned between the memory cells MC. Accordingly, the voltage required for the setting operation and the reset operation can be further reduced compared with the first embodiment.

Otherwise, the resistance change film 202' is configured similar to the resistance change film 202 according to the first embodiment.

The semiconductor memory device according to the second embodiment is manufactured basically similar to the first embodiment. However, in the embodiment, after the process described with reference to FIG. 13, a part of the resistance change film 202 is removed via the opening op2 by the method such as the wet etching using hydrogen fluoride.

Third Embodiment

Figure 17:
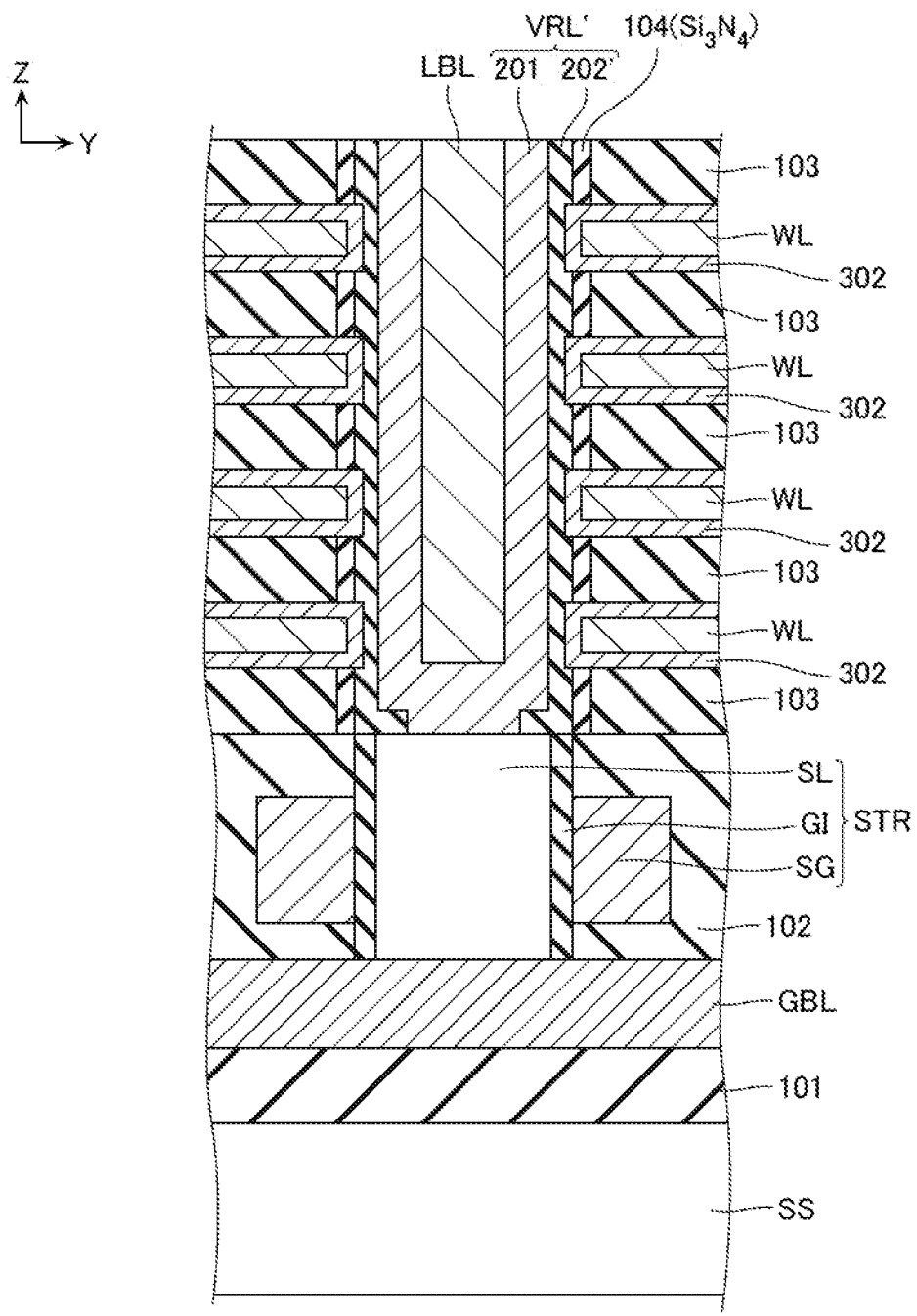
FIG. 17 is a cross-sectional view illustrating a memory cell array of a semiconductor memory device according to a third embodiment.

FIG. 17 is a cross-sectional view illustrating a part of a configuration of a semiconductor memory device according to a third embodiment. In the following description, like reference numerals designate elements corresponding or identical to the elements in the second embodiment, and therefore such elements will not be further elaborated here.

While the semiconductor memory device according to the third embodiment is configured basically similar to the second embodiment, there is a difference in a point where a silicon nitride film 104 is formed between the memory film VRL and the interlayer insulating film 103. The silicon nitride film 104 includes an insulating film of such as silicon nitride ($Si_3N_4$). Here, the density of silicon nitride ($Si_3N_4$) is high compared with silicon oxide ($SiO_2$). Therefore, the spread of copper ions $Cu^+$ into the interlayer insulating film 103 can be suppressed more preferably.

The semiconductor memory device according to the third embodiment is manufactured basically similar to the second embodiment. However, in the embodiment, for example, after the process described with reference to FIG. 11, the silicon nitride film 104 is formed on the side surfaces of the plurality of the interlayer insulating films 103 and the sacrificial films 110 in the Y direction, which expose to the opening op1, and on the upper surface of the semiconductor layer SL. Next, the method such as the RIE is used to remove a part provided on the upper surface of the semiconductor layer SL of the formed silicon nitride film 104. After the process described with reference to FIG. 13, a part of the silicon nitride film 104 exposing to the opening op2 is removed.

Fourth Embodiment

Figure 18:
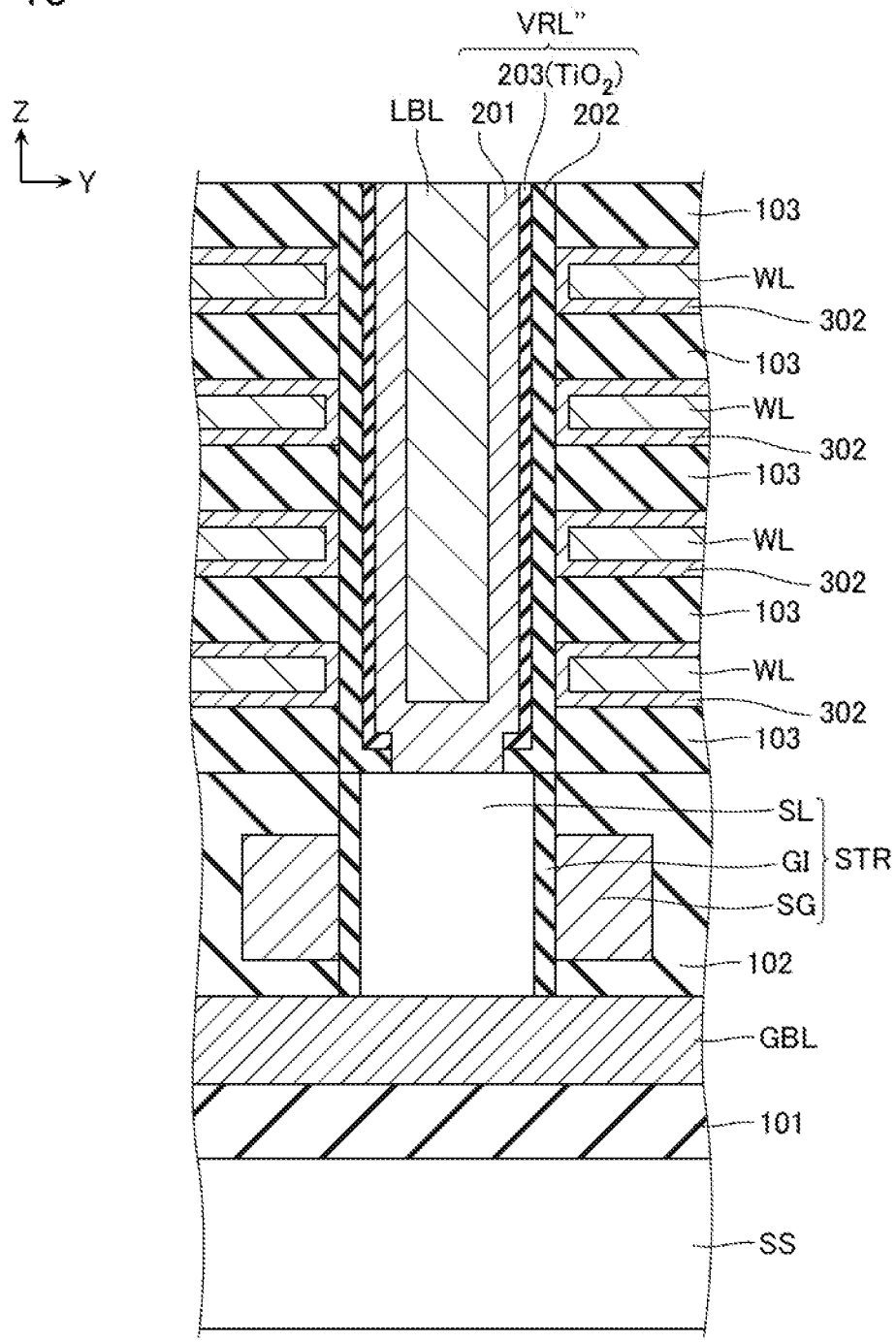
FIG. 18 is a cross-sectional view illustrating a memory cell array of a semiconductor memory device according to a fourth embodiment.

FIG. 18 is a cross-sectional view illustrating a part of a configuration of a semiconductor memory device according to a fourth embodiment. In the following description, like reference numerals designate elements corresponding or identical to the elements in the first embodiment, and therefore such elements will not be further elaborated here.

While the semiconductor memory device according to the fourth embodiment is configured basically similar to the first embodiment, a memory film VRL" has a configuration different from the first embodiment. The memory film VRL" according to the embodiment includes a third resistance change film 203 provided between the metal film 201 and the resistance change film 202 in addition to the metal film 201 and the resistance change film 202. The third resistance change film 203 includes such as titanium oxide ($TiO_2$). The third resistance change film 203 may include a material different from the resistance change film 202, or may include a material similar to the resistance change film 202. The third resistance change film 203 may include such as alumina ($Al_2O_3$), tantalum oxide ($TaO_2$), zirconium oxide ($ZrO_x$), tungsten oxide ($WO_x$), niobium oxide ($NbO_x$).

Figure 19:
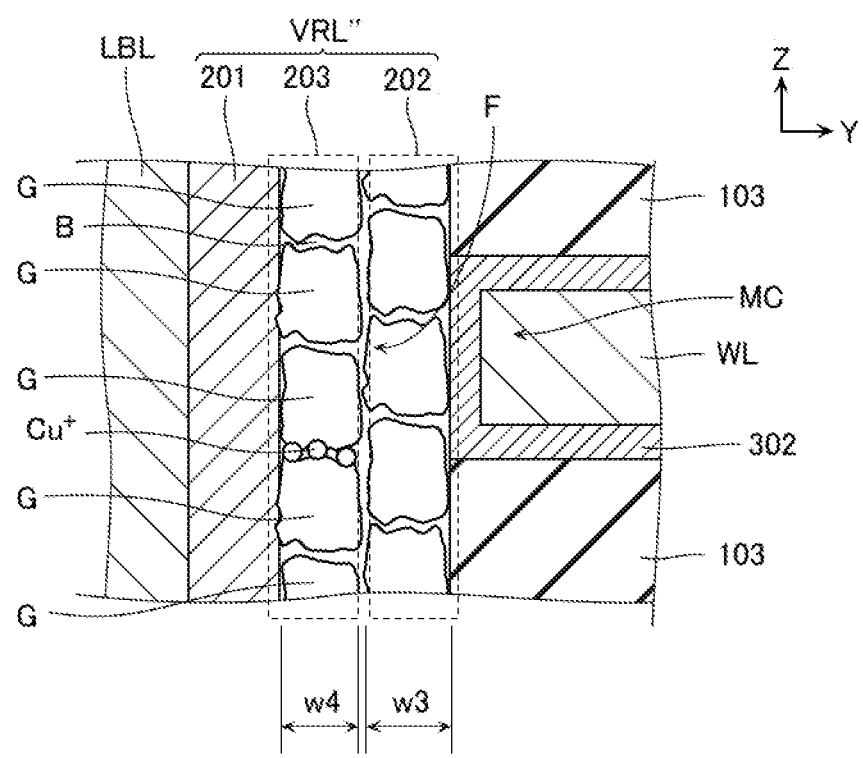
FIG. 19 is a schematic enlarged view of FIG. 18.

FIG. 19 is a schematic cross-sectional view illustrating a part of the configuration of the semiconductor memory device according to the fourth embodiment. The resistance change film 202 and the third resistance change film 203 include a plurality of grains G (crystal grains). Film thicknesses w3 and w4 of the resistance change film 202 and the third resistance change film 203 in the Y direction approximately correspond to the width of the grain G in the Y direction.

Here, the copper ions $Cu^+$ comparatively easily move in a region B between the grains G (grain boundary). Then, when the metal film 201 and the resistance change film 202 directly contact with one another, the copper ions $Cu^+$ is allowed to move comparatively easily to the interlayer insulating film 103.

Therefore, in the embodiment, the third resistance change film 203 is provided between the metal film 201 and the resistance change film 202. This suppresses that the metal film 201 and the interlayer insulating film 103 are connected to one another via the grain boundary B to further appropriately reduce the move of the copper ions $Cu^+$ to the interlayer insulating film 103.

The semiconductor memory device according to the fourth embodiment is manufactured basically similar to the first embodiment. However, in the embodiment, in the process described with reference to FIG. 12, after the resistance change film 202 is formed, the third resistance change film 203 is formed before the metal film 201 is formed.

Fifth Embodiment

Figure 20:
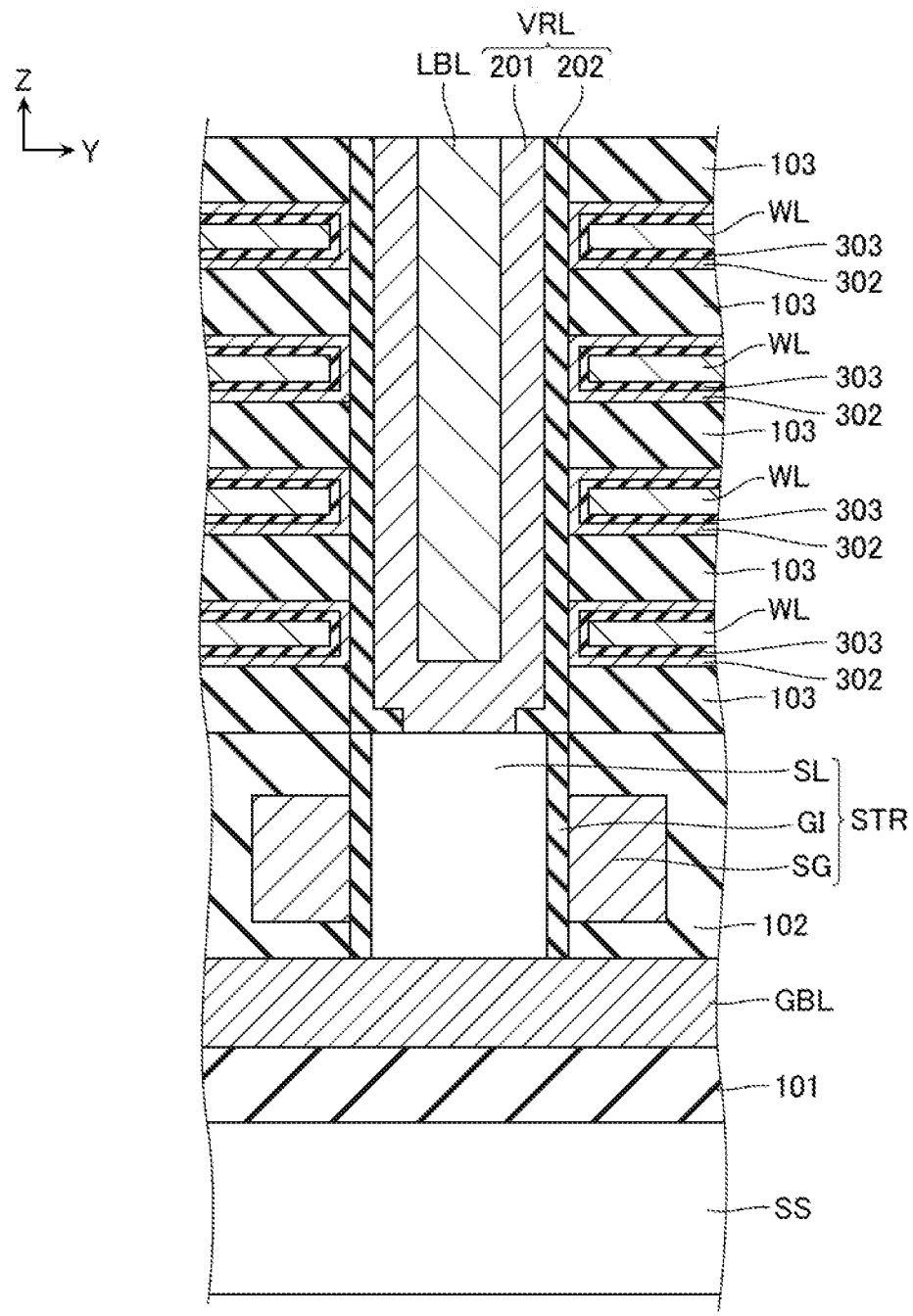
FIG. 20 is a cross-sectional view illustrating a memory cell array of a semiconductor memory device according to a fifth embodiment.
Figure 21:
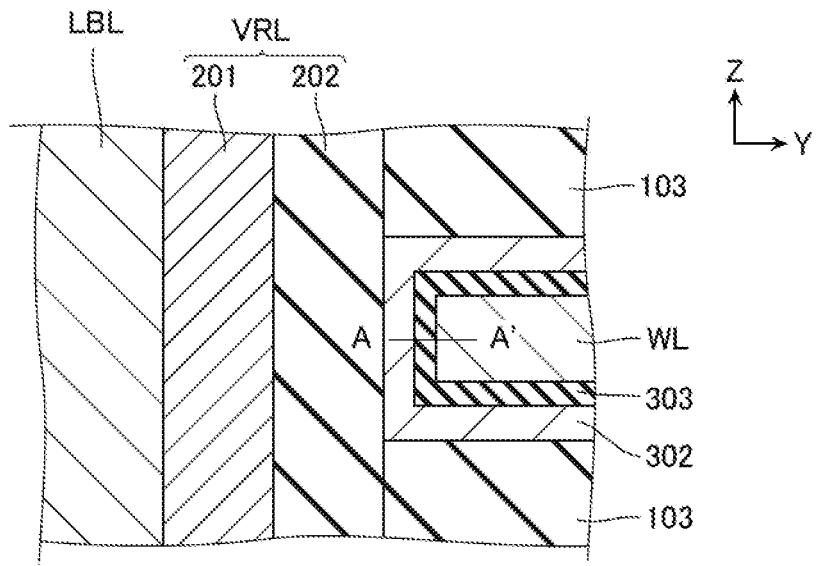
FIG. 21 is an enlarged view of FIG. 20.
Figure 22:
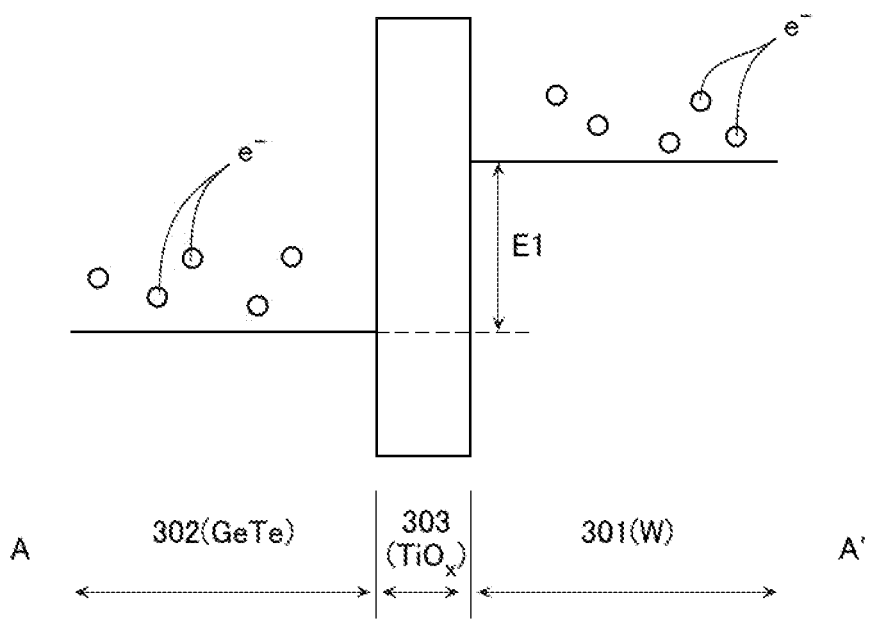
FIG. 22 is an energy band diagram along a line A-A' in FIG. 21.

FIG. 20 is a cross-sectional view illustrating a part of a configuration of a semiconductor memory device according to a fifth embodiment. FIG. 21 is a partially enlarged view of FIG. 20. FIG. 22 is an energy band diagram along a line A-A' in FIG. 21. In the following description, like reference numerals designate elements corresponding or identical to the elements in the first embodiment, and therefore such elements will not be further elaborated here.

As illustrated in FIG. 20, while the semiconductor memory device according to the embodiment is configured basically similar to the first embodiment, as illustrated in FIG. 21, in the embodiment, an insulating film 303 (first insulating film) is provided between the word line WL including such as tungsten (W) and the first film 302 including chalcogen. The insulating film 303 includes an insulating material such as titanium oxide ($TiO_x$).

As illustrated in FIG. 22, in the embodiment, by providing the insulating film 303 between the word line WL and the first film 302, using a difference E1 between a work function of the word line WL and a work function of the first film 302, a rectification can be provided between the word line WL and the first film 302.

The semiconductor memory device according to the fifth embodiment is manufactured basically similar to the first embodiment. However, in the embodiment, after the process described with reference to FIG. 14, the insulating film 303 is formed on the inner wall of the first film 302 via the opening op2. The insulating film 303 is formed by the method such as the CVD.

Sixth Embodiment

Figure 23:
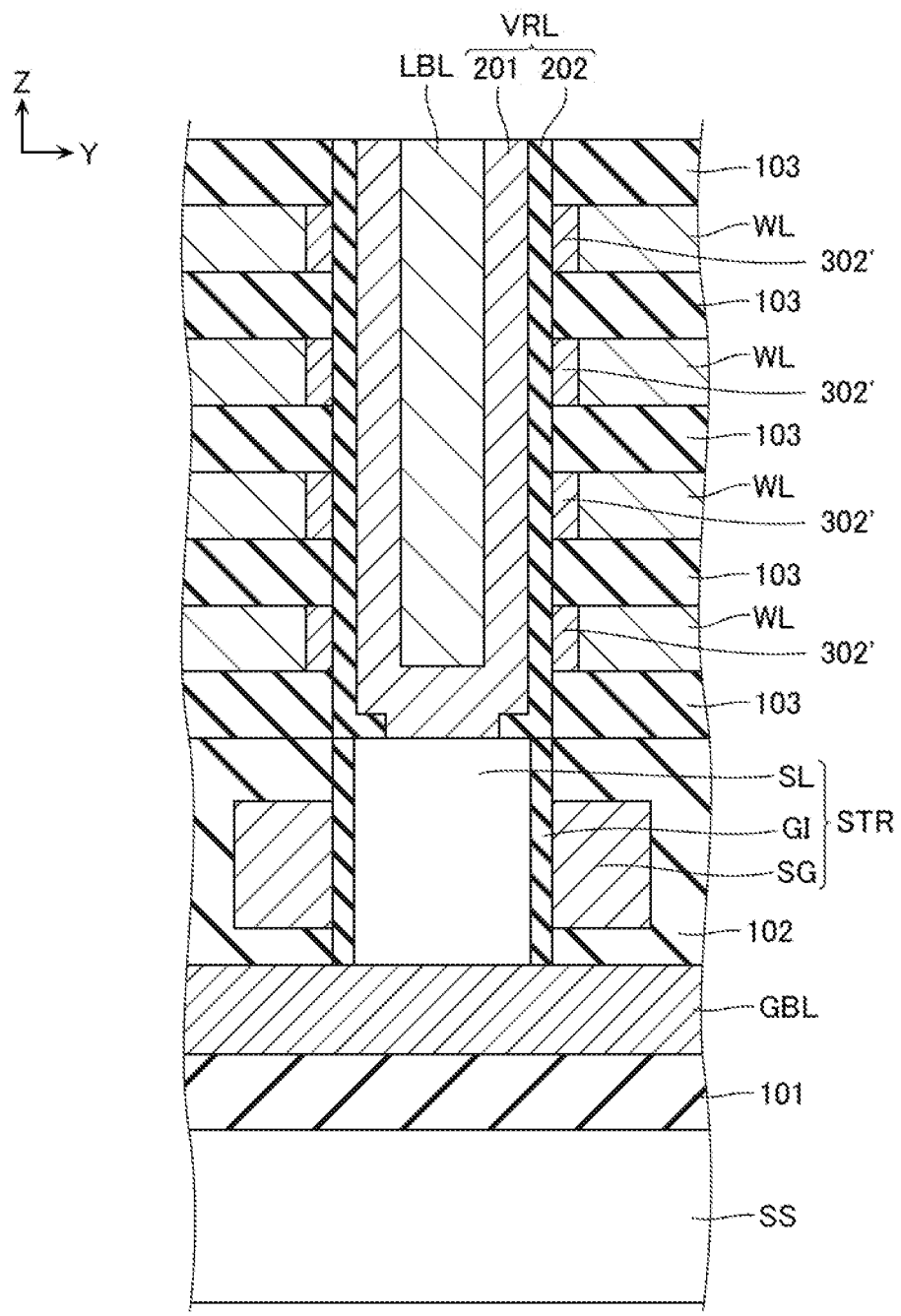
FIG. 23 is a cross-sectional view illustrating a memory cell array of a semiconductor memory device according to a sixth embodiment.

FIG. 23 is a cross-sectional view illustrating a part of a configuration of a semiconductor memory device according to a sixth embodiment. In the following description, like reference numerals designate elements corresponding or identical to the elements in the first embodiment, and therefore such elements will not be further elaborated here.

While the semiconductor memory device according to the embodiment is configured basically similar to the first embodiment, in the embodiment, a first film 302' is provided not on the upper surface and the lower surface of the word line WL.

The manufacturing method for the semiconductor memory device according to the sixth embodiment is similar to the first embodiment until the process described with reference to FIG. 11.

Figure 24:
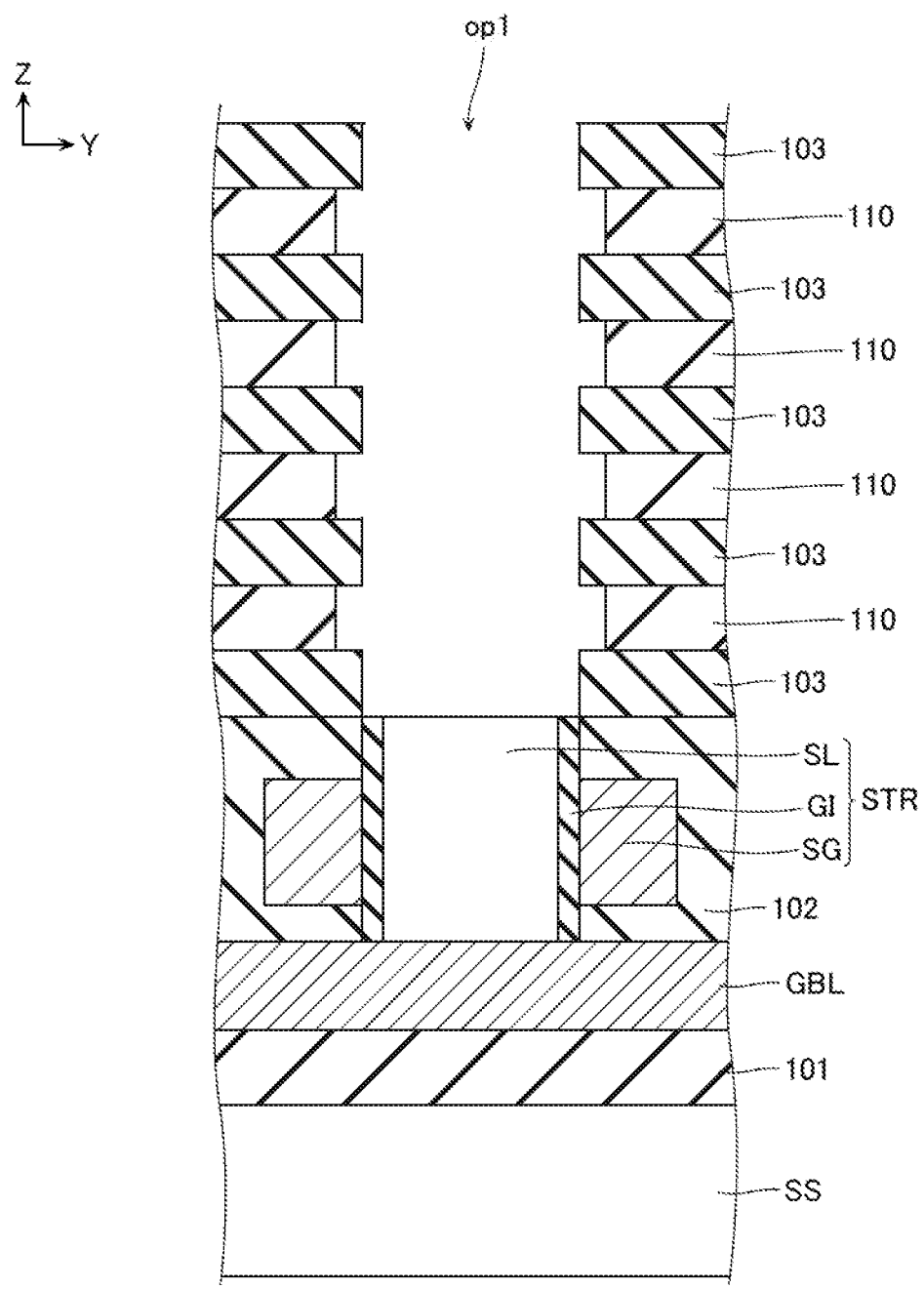
FIG. 24 to FIG. 26 are cross-sectional views illustrating manufacturing processes of the semiconductor memory device according to the sixth embodiment.

As illustrated in FIG. 24, in the embodiment, after the process described with reference to FIG. 11, a part of the sacrificial film 110 is removed via the opening op1. The sacrificial film 110 is removed by such as the wet etching using phosphorus acid.

Figure 25:
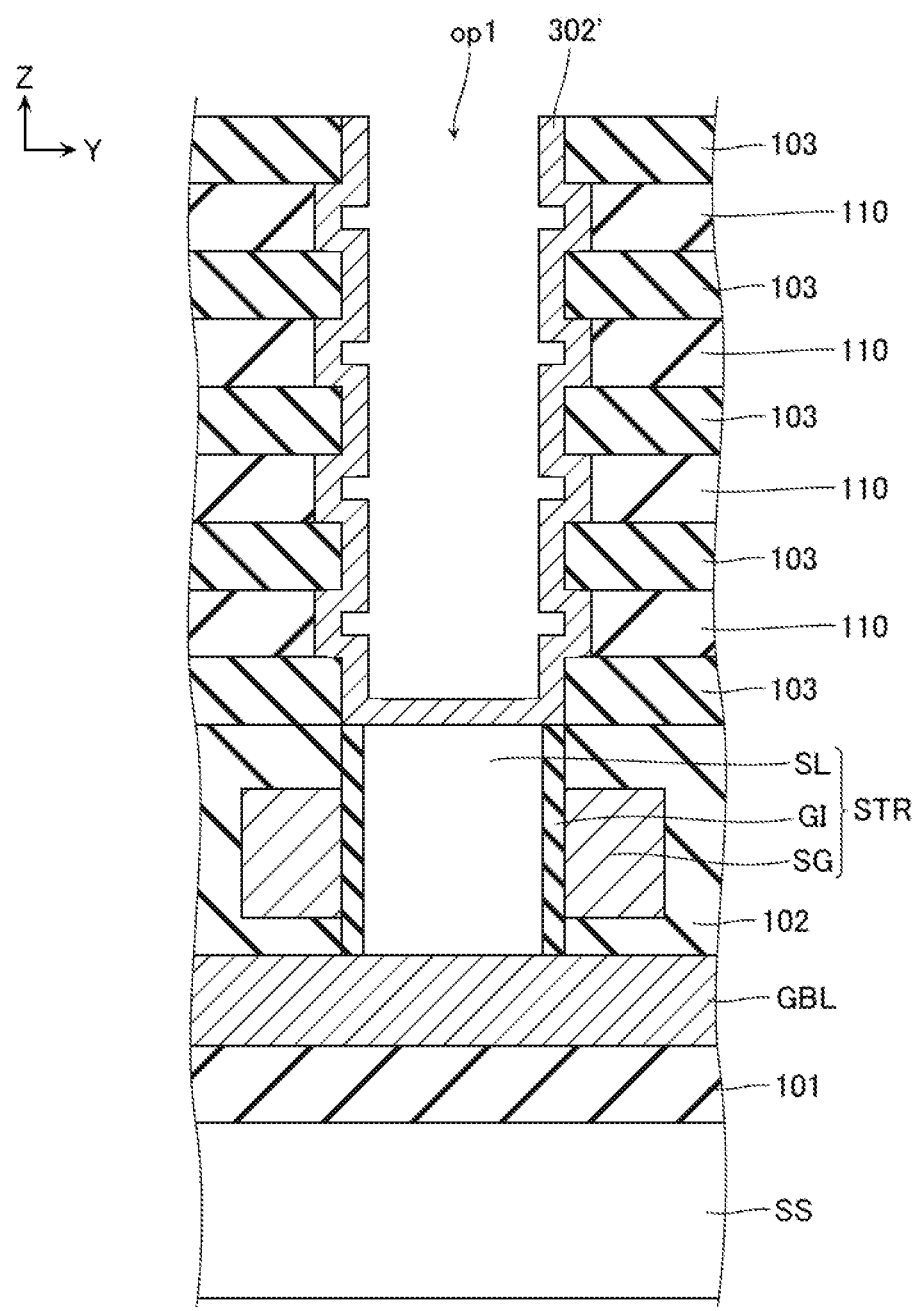

Next, as illustrated in FIG. 25, the first film 302' is formed on the side surfaces of the plurality of the interlayer insulating films 103 and the sacrificial films 110 in the Y direction, which expose to the opening op1, and on the upper surface of the semiconductor layer SL. The first film 302' is formed by the method such as the CVD.

Figure 26:
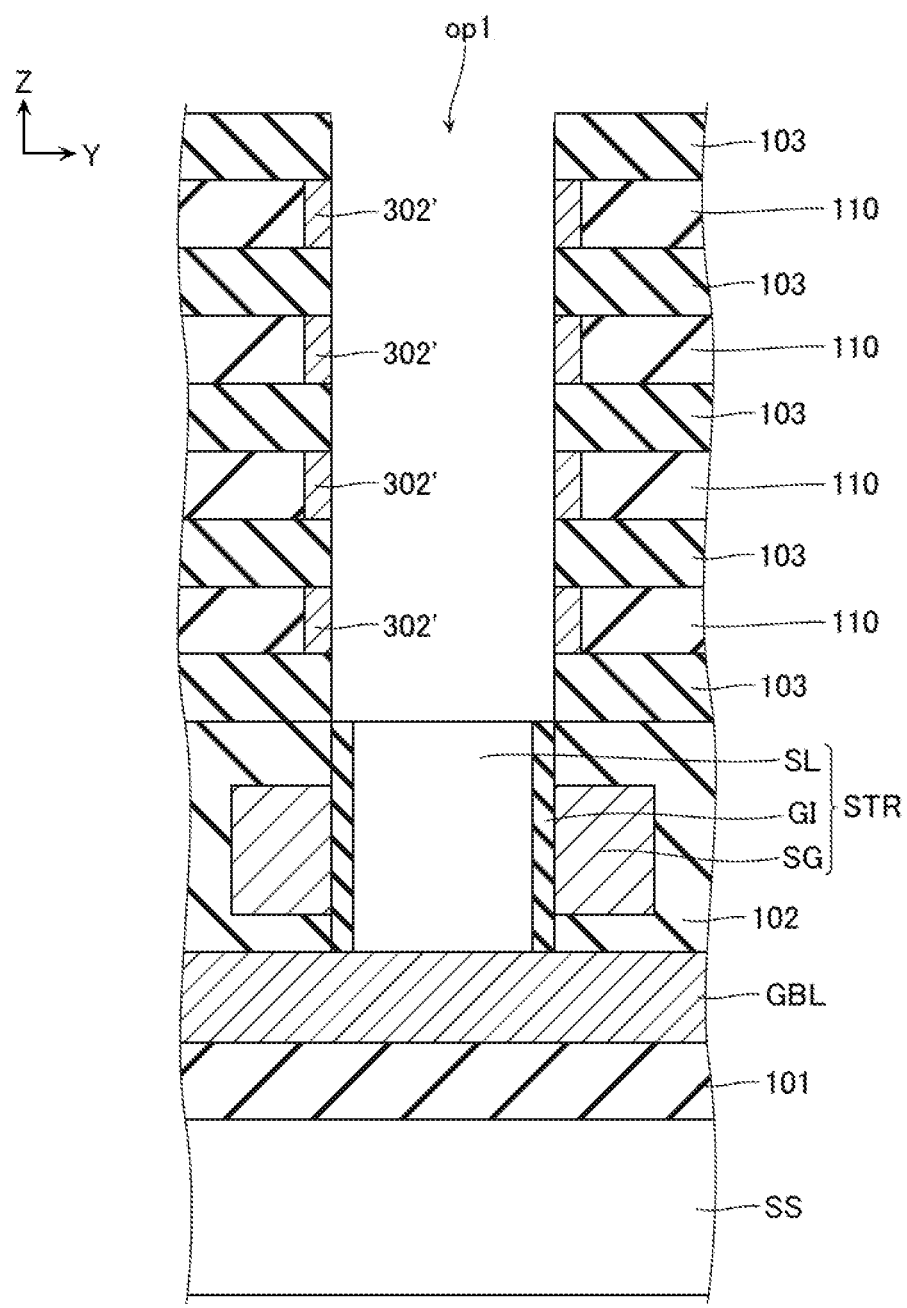

Next, as illustrated in FIG. 26, the method such as the RIE is used to selectively remove the first film 302' except a part. This separates the first film 302' in the Z direction.

Thereafter, the processes described with reference to FIG. 12 and FIG. 13 are performed to form the word line WL including such as tungsten (W) on the side surface of the first film 302' in the Y direction and on the upper surface and the lower surface of the interlayer insulating film 103 via the opening op2. By doing this, the semiconductor memory device according to the sixth embodiment can be manufactured.

Seventh Embodiment

Figure 27:
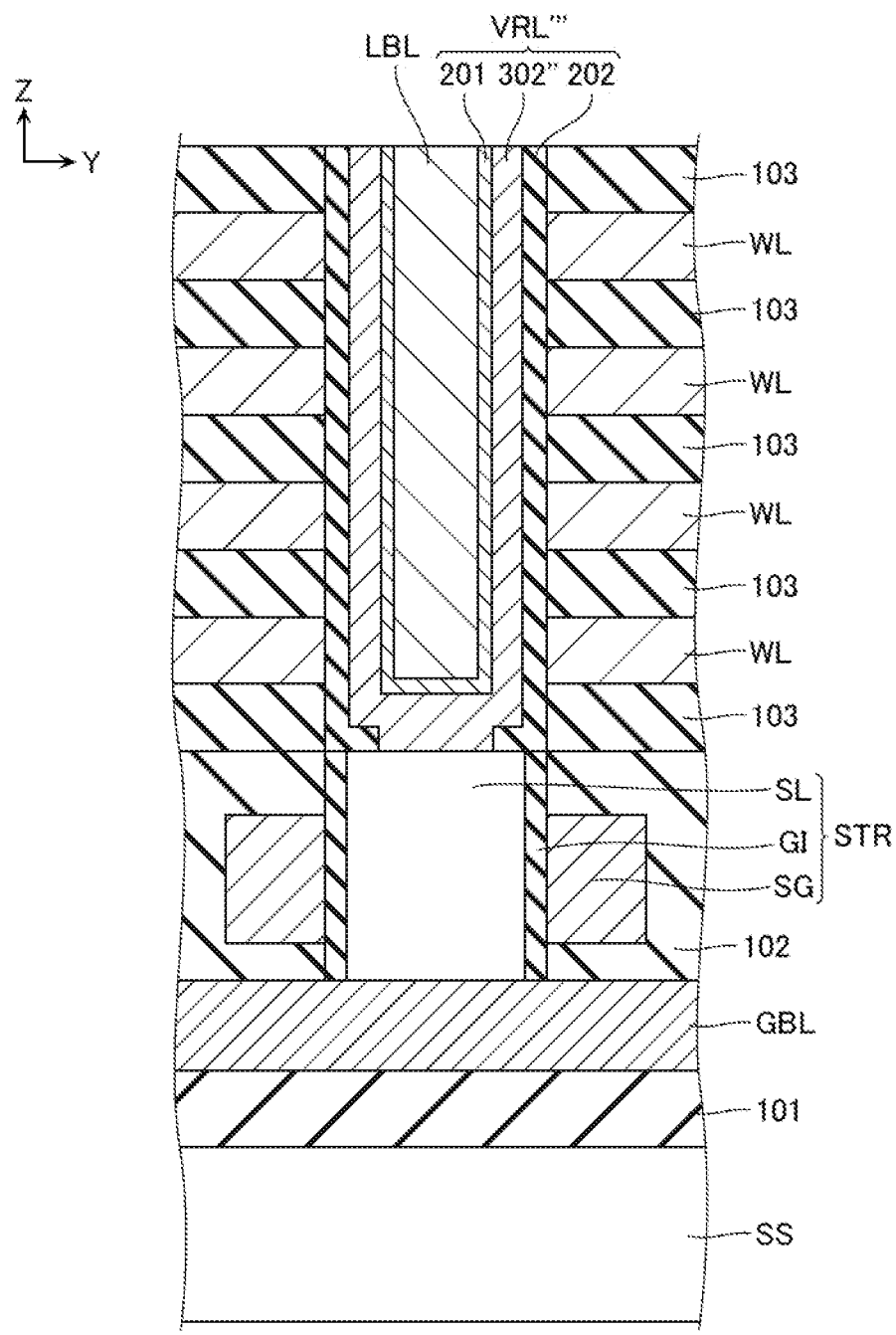
FIG. 27 is a cross-sectional view illustrating a memory cell array of a semiconductor memory device according to a seventh embodiment.

FIG. 27 is a cross-sectional view illustrating a part of a configuration of a semiconductor memory device according to the seventh embodiment. In the following description, like reference numerals designate elements corresponding or identical to the elements in the first embodiment, and therefore such elements will not be further elaborated here.

While the semiconductor memory device according to the seventh embodiment is configured basically similar to the first embodiment, a position of a first film 302" is different from the first embodiment. That is, in the embodiment, the first film 302" is provided not between the word line WL and a memory film VRL''' but between the metal film 201 and the resistance change film 202 in the memory film VRL'''. Otherwise, the memory film VRL''' and the first film 302" are configured similar to the memory film VRL and the first film 302 according to the first embodiment.

The semiconductor memory device according to the seventh embodiment is manufactured basically similar to the first embodiment. However, in the embodiment, in the process described with reference to FIG. 12, after the resistance change film 202 is formed, the first film 302" is formed before the metal film 201 is formed.

Other Embodiments

As described with reference to FIG. 5, in the first embodiment, the local bit line LBL and the select gate transistor STR contact with one another via the metal film 201 in the memory film VRL. However, the local bit line LBL and the select gate transistor STR may directly contact with one another.

In the first embodiment, two select gate lines SG are provided between a pair of the select gate transistors STR adjacent to one another in the Y direction. However, only one select gate line SG may be provided between the pair of the select gate transistors STR adjacent to one another in the Y direction. A select gate line SG of what is called a surround gate type (an aspect where the select gate lines SG are provided so as to surround the side surfaces of each semiconductor layer SL in the X direction and the Y direction) may be employed.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first wiring provided between a first interlayer insulating film and a second interlayer insulating film and extending in a first direction;
a second wiring extending in a second direction intersecting the first direction;
a first memory cell including
a first resistance change film provided between the first wiring and the second wiring,
a first metal film provided between the second wiring and the first resistance change film, and
a first film provided between the first resistance change film and the first wiring,
the first film including chalcogen;
a third wiring extending in the first direction and provided adjacent to the first wiring in a third direction intersecting the first direction and the second direction; and
a second memory cell including
a second resistance change film provided between the third wiring and the second wiring,
a second metal film provided between the second wiring and the second resistance change film, and
a second film provided between the second resistance change film and the third wiring, the second film including chalcogen.

2. The semiconductor memory device according to claim 1, wherein the first resistance change film between the first metal film and the first wiring includes chalcogen.

3. The semiconductor memory device according to claim 1, wherein the first film is provided between the first interlayer insulating film and the first wiring and between the second interlayer insulating film and the first wiring.

4. The semiconductor memory device according to claim 1, wherein
the first resistance change film includes:
a third resistance change film provided between the first metal film and the first film; and
fourth resistance change films provided between the first metal film and the first interlayer insulating film, and between the first metal film and the second interlayer insulating film, and
a film thickness of the third resistance change film is thinner than a film thickness of the fourth resistance change films.

5. The semiconductor memory device according to claim 4, wherein the third resistance change film includes chalcogen.

6. The semiconductor memory device according to claim 1, wherein silicon nitride films including silicon nitride ($Si_3N_4$) are provided between the first resistance change film and the first interlayer insulating film, and between the first resistance change film and the second interlayer insulating film.

7. The semiconductor memory device according to claim 1, wherein a fifth resistance change film is provided between the first metal film and the first resistance change film.

8. The semiconductor memory device according to claim 1, wherein a first insulating film is provided between the first wiring and the first film.

9. The semiconductor memory device according to claim 1, wherein
the first film includes GeSbTe, GeTe, SbTe, or SiTe.

10. The semiconductor memory device according to claim 1, wherein the first resistance change film includes oxygen.

11. The semiconductor memory device according to claim 1, further comprising:
a fourth wiring provided between the second interlayer insulating film and a third interlayer insulating film; and
a third film provided between the first resistance change film and the fourth wiring and including chalcogen,
wherein the third film is apart from the first film.

12. The semiconductor memory device according to claim 11, wherein
the first resistance change film between the first metal film and the first wiring includes chalcogen, and
the first resistance change film between the first metal film and the fourth wiring includes chalcogen.

13. The semiconductor memory device according to claim 1, wherein the second direction intersects with a substrate surface.

14. A semiconductor memory device comprising:
a plurality of first wirings provided in a first direction intersecting with a substrate surface and extending in a second direction intersecting with the first direction;
a second wiring extending in the first direction;
a plurality of third wirings provided in the first direction, extending in the second direction and provided adjacent to the second wiring in a third direction intersecting the first direction and the second direction;
a first resistance change film provided between the first wiring and the second wiring;
a first metal film provided between the second wiring and the first resistance change film;
a plurality of first films separated in the first direction, provided between the first resistance change film and the first wiring, and including chalcogen;
a second resistance change film provided between the third wiring and the second wiring;
a second metal film provided between the second wiring and the second resistance change film; and
a plurality of second films separated in the first direction, provided between the second resistance change film and the third wiring, and including chalcogen.

15. The semiconductor memory device according to claim 14, wherein the first resistance change film between the first metal film and the first wiring includes chalcogen.

16. A semiconductor memory device comprising:
a first wiring provided between a first interlayer insulating film and a second interlayer insulating film and extending in a first direction;
a second wiring extending in a second direction intersecting the first direction;
a first memory cell including
a first resistance change film provided between the first wiring and the second wiring and including a metal material, and
a first film provided between the first resistance change film and the first wiring, the first film including chalcogen;
a third wiring extending in the first direction and provided adjacent to the first wiring in a third direction intersecting the first direction and the second direction; and
a second memory cell including
a second resistance change film provided between the third wiring and the second wiring and including a metal material, and
a second film provided between the second resistance change film and the third wiring, the second film including chalcogen.

17. The semiconductor memory device according to claim 16, wherein
the first resistance change film includes:
a third resistance change film provided between the second wiring and the first film; and
fourth resistance change films provided between the second wiring and the first interlayer insulating film, and between the second wiring and the second interlayer insulating film,
wherein a film thickness of the third resistance change film is thinner than a film thickness of the fourth resistance change films.

* * * * *